United States Patent
Fisher et al.

(10) Patent No.: US 10,418,501 B2
(45) Date of Patent: Sep. 17, 2019

(54) WAFER-INTEGRATED, ULTRA-LOW PROFILE CONCENTRATED PHOTOVOLTAICS (CPV) FOR SPACE APPLICATIONS

(71) Applicant: X-Celeprint Limited, Cork (IE)

(72) Inventors: Brent Fisher, Durham, NC (US);
Matthew Meitl, Durham, NC (US);
Scott Burroughs, Raleigh, NC (US);
Miroslav Samarskiy, Apex, NC (US)

(73) Assignee: X-Celeprint Limited, Cork (IE)

( * ) Notice: Subject to any disclaimer, the term of this patent is extended or adjusted under 35 U.S.C. 154(b) by 273 days.

(21) Appl. No.: 15/282,116

(22) Filed: Sep. 30, 2016

(65) Prior Publication Data
US 2017/0098729 A1    Apr. 6, 2017

Related U.S. Application Data

(60) Provisional application No. 62/236,325, filed on Oct. 2, 2015.

(51) Int. Cl.
*H01L 31/0475*    (2014.01)
*G02B 3/00*    (2006.01)
(Continued)

(52) U.S. Cl.
CPC ........ *H01L 31/0475* (2014.12); *G02B 3/0031* (2013.01); *G02B 3/0056* (2013.01);
(Continued)

(58) Field of Classification Search
CPC ............. H01L 31/0547; H01L 31/0475; H01L 31/0516
See application file for complete search history.

(56) References Cited

U.S. PATENT DOCUMENTS

| | | |
|---|---|---|
| 3,973,996 A | 8/1976 | Kennedy |
| 4,016,586 A | 4/1977 | Anderson et al. |

(Continued)

FOREIGN PATENT DOCUMENTS

| | | |
|---|---|---|
| CN | 1701441 A | 11/2005 |
| CN | 101286531 A | 10/2008 |

(Continued)

OTHER PUBLICATIONS

Li et al., CN-202217686-U, English Machine Translation, May 2012.*

(Continued)

*Primary Examiner* — Tae-Sik Kang
(74) *Attorney, Agent, or Firm* — William R. Haulbrook; Michael D. Schmitt; Choate, Hall & Stewart LLP

(57) ABSTRACT

A concentrator-type photovoltaic module includes a plurality of photovoltaic cells having respective surface areas of less than about 4 square millimeters (mm) electrically interconnected in series and/or parallel on a backplane surface, and an array of concentrating optical elements having respective aperture dimensions of less than about 30 mm and respective focal lengths of less than about 50 mm. The array of concentrating optical elements is positioned over the photovoltaic cells based on the respective focal lengths to concentrate incident light on the photovoltaic cells, and is integrated on the backplane surface by at least one spacer structure on the backplane surface. Related devices, operations, and fabrication methods are also discussed.

20 Claims, 23 Drawing Sheets
(21 of 23 Drawing Sheet(s) Filed in Color)

(51) Int. Cl.
  *G02B 19/00* (2006.01)
  *H01L 31/054* (2014.01)
(52) U.S. Cl.
  CPC ..... *G02B 19/0014* (2013.01); *G02B 19/0042* (2013.01); *G02B 19/0076* (2013.01); *H01L 31/0543* (2014.12); *G02B 3/0087* (2013.01); *Y02E 10/52* (2013.01)

(56) References Cited

U.S. PATENT DOCUMENTS

| | | |
|---|---|---|
| 4,069,812 A | 1/1978 | O'Neill |
| 4,180,414 A | 12/1979 | Diamond et al. |
| 4,204,881 A | 5/1980 | McGrew |
| 4,255,212 A | 3/1981 | Chappell et al. |
| 4,338,480 A | 7/1982 | Antypas et al. |
| 4,522,193 A | 6/1985 | Bates |
| 4,711,972 A | 12/1987 | O'Neill |
| 4,834,805 A | 5/1989 | Erbert |
| 4,879,760 A | 11/1989 | Kroll et al. |
| 4,893,612 A | 1/1990 | Dawson |
| 4,956,877 A | 9/1990 | Kroll et al. |
| 5,096,505 A | 3/1992 | Fraas et al. |
| 5,118,361 A | 6/1992 | Fraas et al. |
| 5,125,983 A | 6/1992 | Cummings |
| 5,162,935 A | 11/1992 | Nelson |
| 5,167,724 A | 12/1992 | Chiang |
| 5,344,497 A | 9/1994 | Fraas et al. |
| 5,460,659 A | 10/1995 | Krut |
| 5,498,297 A | 3/1996 | O'Neill et al. |
| 5,505,789 A | 4/1996 | Fraas et al. |
| 5,837,561 A | 11/1998 | Kish, Jr. et al. |
| 6,031,179 A | 2/2000 | O'Neill |
| 6,075,200 A | 6/2000 | O'Neill |
| 6,091,017 A | 7/2000 | Stern |
| 6,142,358 A | 11/2000 | Cohn et al. |
| 6,162,986 A | 12/2000 | Shiotsuka et al. |
| 6,215,060 B1 | 4/2001 | Komori et al. |
| 6,252,155 B1 | 6/2001 | Ortabasi |
| 6,288,324 B1 | 9/2001 | Komori et al. |
| 6,399,874 B1 | 6/2002 | Olah |
| 6,493,121 B1 | 12/2002 | Althaus |
| 6,678,444 B2 | 1/2004 | Tayebati |
| 6,717,045 B2 | 4/2004 | Chen |
| 6,730,840 B2 | 5/2004 | Sasaoka et al. |
| 6,804,062 B2 | 10/2004 | Atwater et al. |
| 7,195,733 B2 | 3/2007 | Rogers et al. |
| 7,299,632 B2 | 11/2007 | Laing et al. |
| 7,388,146 B2 | 6/2008 | Fraas et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,638,708 B2 | 12/2009 | Fork et al. |
| 7,638,750 B2 | 12/2009 | Kline |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,868,244 B2 | 1/2011 | Bendapudi et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 8,035,027 B2 | 10/2011 | Moslehi |
| 8,470,701 B2 | 6/2013 | Rogers et al. |
| 8,558,243 B2 | 10/2013 | Bibl et al. |
| 8,791,474 B1 | 7/2014 | Bibl et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,941,215 B2 | 1/2015 | Hu et al. |
| 8,974,899 B1 | 3/2015 | Wilt |
| 8,987,765 B2 | 3/2015 | Bibl et al. |
| 9,105,714 B2 | 8/2015 | Hu et al. |
| 9,111,464 B2 | 8/2015 | Bibl et al. |
| 9,139,425 B2 | 9/2015 | Vestyck |
| 9,153,171 B2 | 10/2015 | Sakariya et al. |
| 9,161,448 B2 | 10/2015 | Menard et al. |
| 9,166,114 B2 | 10/2015 | Hu et al. |
| 9,178,123 B2 | 11/2015 | Sakariya et al. |
| 9,217,541 B2 | 12/2015 | Bathurst et al. |
| 9,240,397 B2 | 1/2016 | Bibl et al. |
| 9,252,375 B2 | 2/2016 | Bibl et al. |
| 9,254,505 B2 | 2/2016 | Connor et al. |
| 9,358,775 B2 | 6/2016 | Bower et al. |
| 9,367,094 B2 | 6/2016 | Bibl et al. |
| 9,412,727 B2 | 8/2016 | Menard et al. |
| 9,478,583 B2 | 10/2016 | Hu et al. |
| 9,484,504 B2 | 11/2016 | Bibl et al. |
| 9,520,537 B2 | 12/2016 | Bower et al. |
| 9,555,644 B2 | 1/2017 | Rogers et al. |
| 9,583,533 B2 | 2/2017 | Hu et al. |
| 9,601,356 B2 | 3/2017 | Bower et al. |
| 9,640,715 B2 | 5/2017 | Bower et al. |
| 9,716,082 B2 | 7/2017 | Bower et al. |
| 9,761,754 B2 | 9/2017 | Bower et al. |
| 9,765,934 B2 | 9/2017 | Rogers et al. |
| 9,865,832 B2 | 1/2018 | Bibl et al. |
| 9,929,053 B2 | 3/2018 | Bower et al. |
| 2001/0029974 A1 | 10/2001 | Cohen et al. |
| 2003/0015637 A1 | 1/2003 | Liebendorfer |
| 2003/0086653 A1 | 5/2003 | Kuhara |
| 2003/0141570 A1 | 7/2003 | Chen et al. |
| 2005/0081908 A1 | 4/2005 | Stewart |
| 2005/0150542 A1 | 7/2005 | Madan |
| 2005/0155641 A1 | 7/2005 | Fafard |
| 2005/0247339 A1 | 11/2005 | Barnham et al. |
| 2006/0028156 A1 | 2/2006 | Jungwirth |
| 2006/0033833 A1 | 2/2006 | Hurwitz et al. |
| 2006/0063309 A1 | 3/2006 | Sugiyama et al. |
| 2006/0231133 A1 | 10/2006 | Fork et al. |
| 2006/0246301 A1 | 11/2006 | Stachowiak |
| 2006/0250135 A1 | 11/2006 | Buchwald et al. |
| 2006/0283497 A1 | 12/2006 | Hines |
| 2007/0063202 A1 | 3/2007 | Leib et al. |
| 2007/0070531 A1 | 3/2007 | Lu |
| 2007/0121113 A1 | 5/2007 | Cohen et al. |
| 2007/0137698 A1 | 6/2007 | Wanlass et al. |
| 2007/0277810 A1 | 12/2007 | Stock |
| 2008/0041441 A1 | 2/2008 | Schwartzman |
| 2008/0057776 A1 | 3/2008 | Cummings |
| 2008/0087321 A1 | 4/2008 | Schwartzman |
| 2008/0087323 A1 | 4/2008 | Araki et al. |
| 2008/0121269 A1 | 5/2008 | Welser et al. |
| 2008/0142070 A1 | 6/2008 | Lechner et al. |
| 2008/0185034 A1 | 8/2008 | Corio |
| 2008/0190478 A1 | 8/2008 | Lin |
| 2008/0193135 A1 | 8/2008 | Du et al. |
| 2008/0236661 A1 | 10/2008 | Yao et al. |
| 2008/0276983 A1 | 11/2008 | Drake et al. |
| 2008/0283117 A1 | 11/2008 | Tsunomura |
| 2008/0295883 A1 | 12/2008 | Ducellier et al. |
| 2009/0065044 A1 | 3/2009 | Kim |
| 2009/0126794 A1 | 5/2009 | Dimroth et al. |
| 2009/0194145 A1 | 8/2009 | Kribus et al. |
| 2009/0199890 A1 | 8/2009 | Hering et al. |
| 2009/0199891 A1 | 8/2009 | Hering et al. |
| 2009/0223555 A1 | 9/2009 | Ammar |
| 2009/0250094 A1 | 10/2009 | Robison et al. |
| 2009/0250095 A1 | 10/2009 | Thorley et al. |
| 2009/0261258 A1 | 10/2009 | Harris et al. |
| 2009/0261802 A1 | 10/2009 | Askins et al. |
| 2009/0266395 A1 | 10/2009 | Murthy et al. |
| 2009/0272420 A1 | 11/2009 | Kare |
| 2009/0272427 A1 | 11/2009 | Bett et al. |
| 2009/0277493 A1 | 11/2009 | Merkle |
| 2009/0298218 A1 | 12/2009 | Federici et al. |
| 2009/0308432 A1 | 12/2009 | Meyers |
| 2010/0012171 A1 | 1/2010 | Ammar |
| 2010/0014854 A1 | 1/2010 | Healey et al. |
| 2010/0018420 A1 | 1/2010 | Menard |
| 2010/0065120 A1 | 3/2010 | McDonald |
| 2010/0089440 A1 | 4/2010 | Gray et al. |
| 2010/0132756 A1 | 6/2010 | Tonooka et al. |
| 2010/0148293 A1 | 6/2010 | Jain et al. |
| 2010/0236603 A1 | 9/2010 | Menard et al. |

(56) References Cited

U.S. PATENT DOCUMENTS

| | | |
|---|---|---|
| 2010/0282288 A1 | 11/2010 | Cornfeld |
| 2010/0306993 A1 | 12/2010 | Mayyas et al. |
| 2010/0313954 A1 | 12/2010 | Seel et al. |
| 2010/0319773 A1 | 12/2010 | West et al. |
| 2011/0011445 A1 | 1/2011 | Spencer et al. |
| 2011/0030762 A1 | 2/2011 | Kim |
| 2011/0048535 A1 | 3/2011 | Nagyvary et al. |
| 2011/0061717 A1 | 3/2011 | Kwon et al. |
| 2011/0135955 A1 | 6/2011 | Maschwitz et al. |
| 2011/0139225 A1 | 6/2011 | Boydell |
| 2011/0155230 A1 | 6/2011 | Tsai et al. |
| 2011/0174366 A1 | 7/2011 | Frolov et al. |
| 2011/0266561 A1 | 11/2011 | Rogers et al. |
| 2011/0277815 A1 | 11/2011 | Sankrithi |
| 2012/0111390 A1 | 5/2012 | Dai |
| 2012/0128371 A1 | 5/2012 | Einicke et al. |
| 2013/0034357 A1 | 2/2013 | Lim |
| 2013/0146120 A1 | 6/2013 | Seel et al. |
| 2013/0153934 A1 | 6/2013 | Meitl et al. |
| 2013/0285477 A1 | 10/2013 | Lo et al. |
| 2013/0316487 A1 | 11/2013 | de Graff et al. |
| 2014/0090687 A1* | 4/2014 | Den Boer ............... H02S 20/26 136/246 |
| 2014/0159043 A1 | 6/2014 | Sakariya et al. |
| 2014/0261627 A1* | 9/2014 | Meitl .................. H01L 31/0543 136/246 |
| 2014/0261628 A1 | 9/2014 | Meitl et al. |
| 2015/0028362 A1 | 1/2015 | Chan et al. |
| 2015/0219975 A1 | 8/2015 | Phillips et al. |
| 2015/0295114 A1 | 10/2015 | Meitl et al. |
| 2016/0093600 A1 | 3/2016 | Bower et al. |
| 2016/0308103 A1 | 10/2016 | Hu et al. |
| 2017/0018675 A1 | 1/2017 | Meitl et al. |
| 2017/0019180 A1 | 1/2017 | Lucrecio et al. |
| 2017/0047462 A1 | 2/2017 | Ishigaki |
| 2017/0093501 A1 | 3/2017 | Meitl et al. |
| 2017/0338374 A1 | 11/2017 | Zou et al. |

FOREIGN PATENT DOCUMENTS

| | | |
|---|---|---|
| CN | 102110595 A | 6/2011 |
| CN | 202217686 U * | 5/2012 |
| CN | 102944576 A | 2/2013 |
| DE | 10 2008 017 370 A1 | 8/2009 |
| EP | 0 657 948 A2 | 6/1995 |
| EP | 1 835 547 A1 | 9/2007 |
| EP | 1 956 662 A2 | 8/2008 |
| EP | 3001586 A1 | 3/2016 |
| GB | 1 529 409 A | 10/1978 |
| JP | H1 051020 A | 2/1998 |
| TW | 221525 B | 3/1994 |
| WO | WO-82/04500 A1 | 12/1982 |
| WO | WO-91/18419 A1 | 11/1991 |
| WO | WO-02/025842 A2 | 3/2002 |
| WO | WO-03/019617 A2 | 3/2003 |
| WO | WO-2006/128417 A1 | 12/2006 |
| WO | WO-2008/117297 A2 | 10/2008 |
| WO | WO-2008/143635 A1 | 11/2008 |
| WO | WO-2009/008996 A2 | 1/2009 |
| WO | WO-2009/061493 A1 | 5/2009 |
| WO | WO-2009/100894 A2 | 8/2009 |
| WO | WO-2010/091391 A2 | 8/2010 |
| WO | WO-2011/156344 A2 | 12/2011 |
| WO | WO-2012/115603 A1 | 8/2012 |
| WO | WO-2014/096200 A1 | 6/2014 |
| WO | WO-2014/142650 A1 | 9/2014 |
| WO | WO-2017/059079 A1 | 4/2017 |
| WO | WO-2017/105581 A2 | 6/2017 |

OTHER PUBLICATIONS

Andreev, Viacheslav et al., Concentrator PV Modules of "All-Glass" Design with Modified Structure, May 11-18, 2003, Paper #p-C3-72 presented at WCPEC-3, Osaka, Japan, pp. 1-4.

Baranov et al., Semiconductor Lasers: Fundamentals and Applications, Woodhead Publishing Limited, 33:319-319, (2013).

Bub, R. et al., Optical Signal and Energy Transmission for Implantable Intraocular Microsystems, 5 pages, 2006.

Derkacs, D. et al., Lattice-matched multijunction solar cells employing a 1 eV GaInNAsSb bottom cell, Journal of Photonics for Energy, 2:021805 (2012).

Friedman, D. J. et al., Analysis of Multijunction Solar Cell Current-Voltage Characteristics in the Presence of Luminescent Coupling, IEEE J. Photovoltaics, 3(4):1429-1436 (2013).

Friedman, D. J. et al., Effect of Luminescent Coupling on the Optimal Design of Multijunction Solar Cells, IEEE J. Photovoltaics, 4(3):986-990 (2014).

Geisz, J. F. et al., High-efficiency GaInP/GaAs/InGaAs triple-junction solar cells grown inverted with a metamorphic bottom junction, Applied Physics Letters, 91(2):023502 (2007).

Gupta, S.C., Optoelectronic Devices and Systems, PHI Learning Pvt. Ltd., pp. 126-130, (2014).

He, Miao et al., Reflowed solgel spherical microlens for high-efficiency optical coupling between a laser diode and a single-mode fiber, Mar. 10, 2005, Applied Optics, vol. 44, No. 8, pp. 1469-1473.

Helmers, Henning, PV-Cells for Optical Power Transmission, Franhofer Institute for Solar Energy Systems, Mar. 2014, From URLS: https://www.ise.fraunhofer.de/de/veroeffentlichungen/veroeffentlichungen-pdf-dateien/infomaterial/broschueren-und-produktinformationen/geschaeftsfelder/flyer-pv-cells-for-optical-power-transmission.pdf (2pages).

International Search Report, PCT/US2016/054735, 4 pages, dated Jul. 17, 2017.

Jeong, W-S. et al., Evaluation of external quantum efficiency of a 12.35% tandem solar cell comprising dye-sensitized and CIGS solar cells, Solar Energy Materials & Solar Cells, 95:3419-3423 (2011).

Keiser, Gerd, Optical Communications Essentials, McGraw-Hill, pp. 87-89 and 107-112, (2003).

Kim, D. et al., Fabrication of rough Al doped ZnO films deposited by low pressure chemical vapor deposition for high efficiency thin film solar cells, Current Applied Physics, 10:S459-S462 (2010).

Kim, D. et al., High Efficiency Silicon and Germanium Stack Junction Solar Cells, 2012 IEEE International Electron Devices Meeting (IEDM), Dec. 10-13, 2012, pp. 12.6.1-12.6.4.

Kurtz, S. et al., A Comparison of Theoretical Efficiencies of Multi-junction Concentrator Solar Cells, Progress in Photovoltaics: research and applications, 16(6):537-546 (2008).

Lentine et al., Optimal Cell Connections for Improved Shading, Reliability, and Spectral Performance of Microsystem Enabled Photovoltaic (MEPV) Modules, IEEE, pp. 3048-3054, (2010).

Manasreh, M.O., Strained-Layer Quantum Wells and Their Applications, Gordon and Breach Science Publishers, pp. 529-532 (1997).

Marti, A. et al., Limiting efficiencies for photovoltaic energy conversion in multigap systems, Solar Energy Materials and Solar Cells, 43(2):203-222 (1996).

RP Photonics Encyclopedia, Photodiodes, 6 pages, Dec. 2014, <http://www.rp-photonics.com/photodiode>.

Silicone Fluids; Gelest Inc.; <http://www.gelest.com/goods/pdf/siliconefluids.pdf%3B> 1998; pp. 1.

Steiner, M. A. et al., Experimental and modeling analysis of internal luminescence in III-V solar cells, 57-61 (2013).

Steiner, M. A. et al., Non-linear luminescent coupling in series-connected multijunction solar cells, Applied Physics Letters, 100(25):251106-1-251106-5 (2012).

Steiner, M. et al., Measuring IV curves and subcell photocurrents in the presence of luminescent coupling, IEEE Journal of Photovoltaics, 3(2):879-887 (2013).

Sun, G. et al., High efficiency thin-film crystalline Si/Ge tandem solar cell, Optics Express, vol. 18, Issue 4, pp. 3746-3753 (2010), https://doi.org/10.1364/0E.18.003746.

Thorlabs Specification Sheet for LA5458—Plano-convex Lens, Copyright 1999-2012 Thorlabs.

Written Opinion, PCT/US2016/054735, 11 pages, dated Jul. 17, 2017.

(56) References Cited

OTHER PUBLICATIONS

Bower, C. A. et al., Transfer Printing: An Approach for Massively Parallel Assembly of Microscale Devices, IEE, Electronic Components and Technology Conference, (2008).

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341 (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Gent, A.N., Adhesion and Strength of Viscoelastic Solids. Is There a Relationship between Adhesion and Bulk Properties?, American Chemical Society, Langmuir, 12(19):4492-4496, (1996).

Kim, Dae-Hyeong et al., Optimized Structural Designs for Stretchable Silicon Integrated Circuits, Small, 5(24):2841-2847, (2009).

Kim, Dae-Hyeong et al., Stretchable and Foldable Silicon Integrated Circuits, Science, 320:507-511, (2008).

Kim, S. et al., Microstructured elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

Zappe, Hans, Laser Diode Microsystems , Springer-Verlag Berlin Heidelberg, pp. 144-149, 162-163, 277-278, (2004).

\* cited by examiner

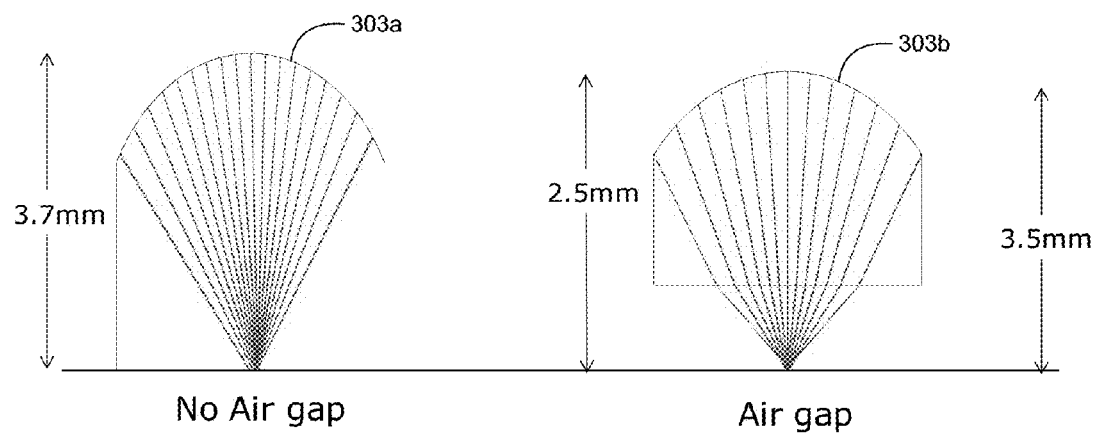
No Air gap
FIGURE 3A
Air gap
FIGURE 3B
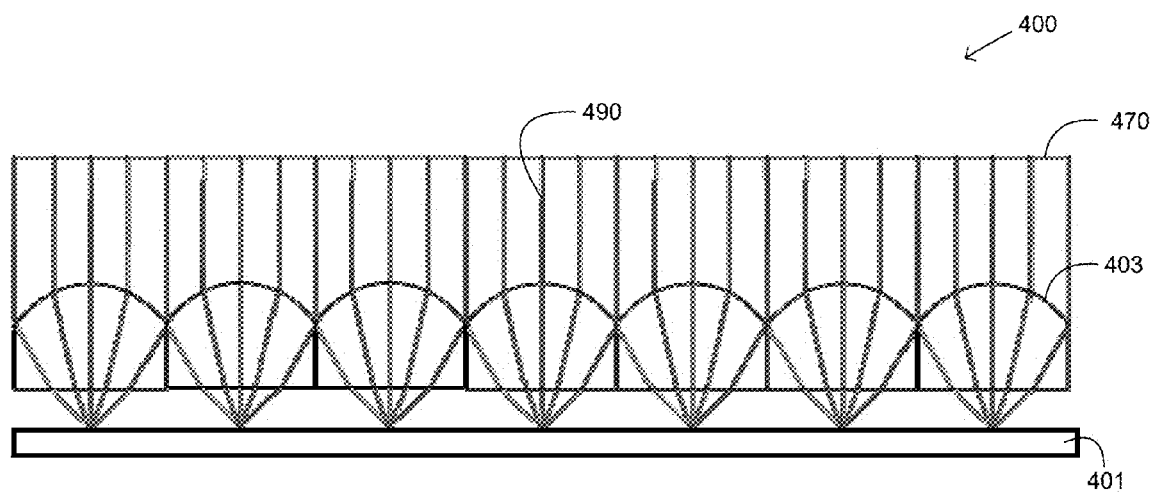
FIGURE 4

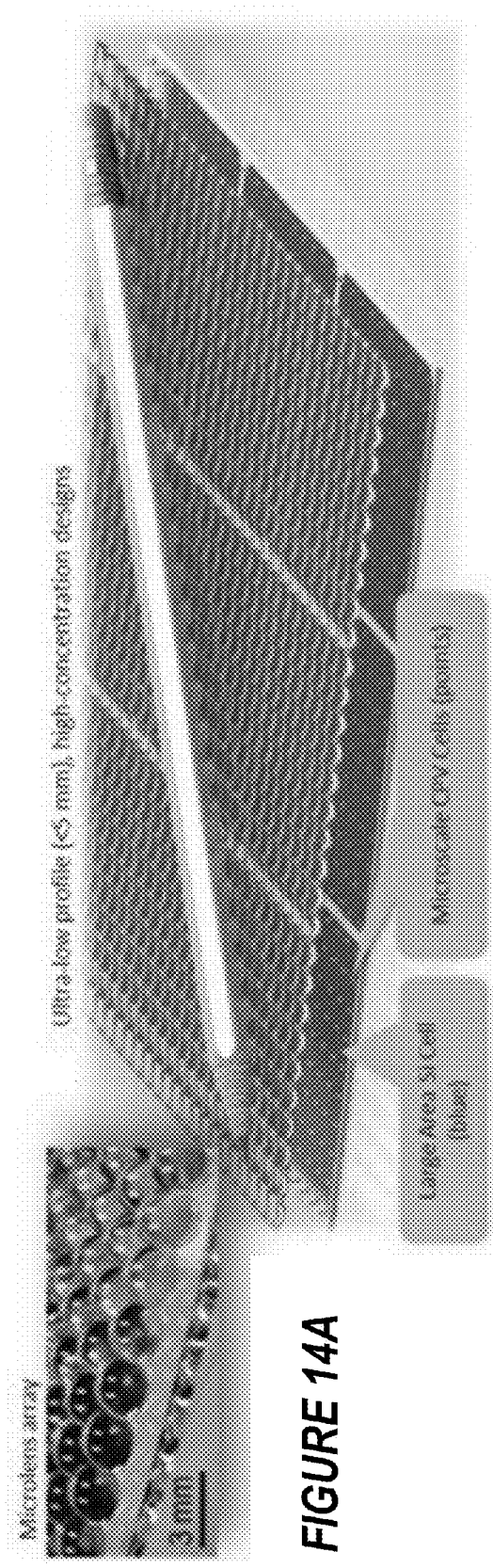
FIGURE 14A
FIGURE 14B
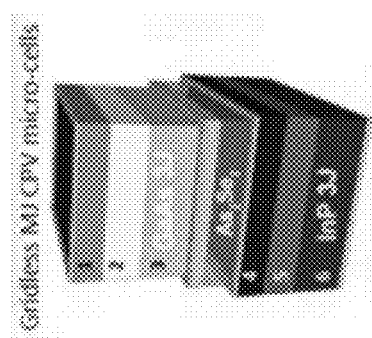
FIGURE 14C
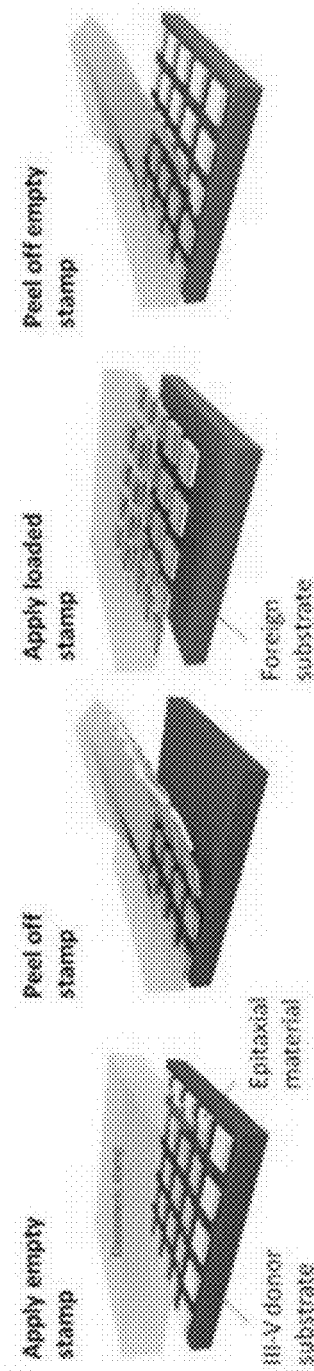
FIGURE 14D

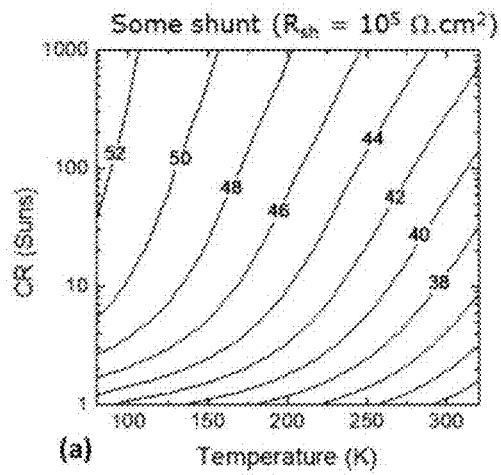
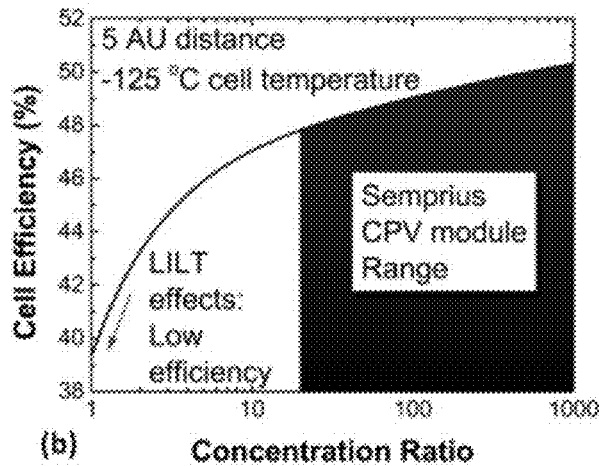
FIGURE 21A  FIGURE 21B
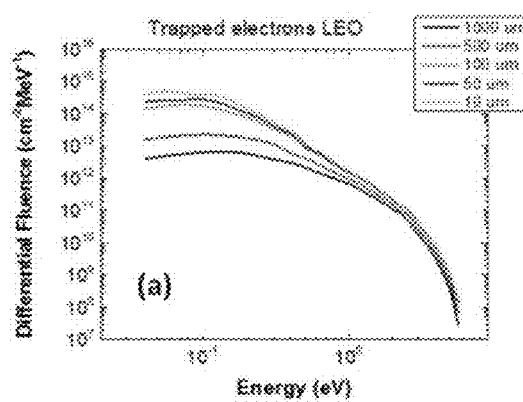
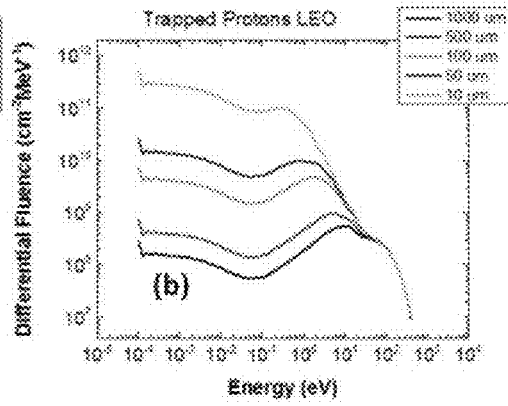
FIGURE 22A
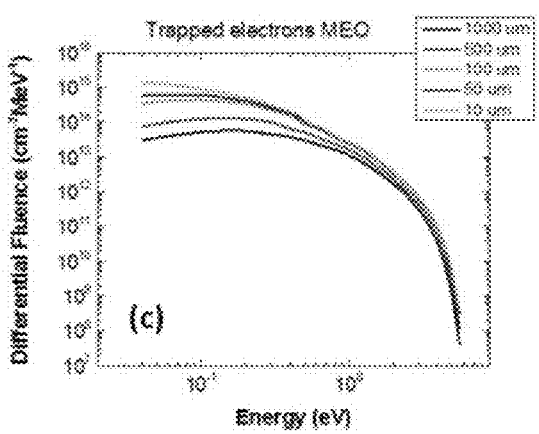
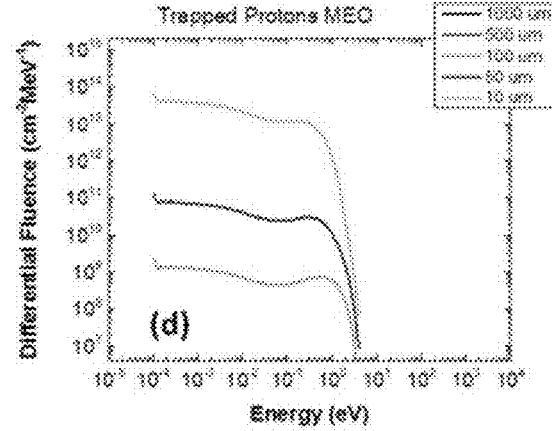
FIGURE 22B

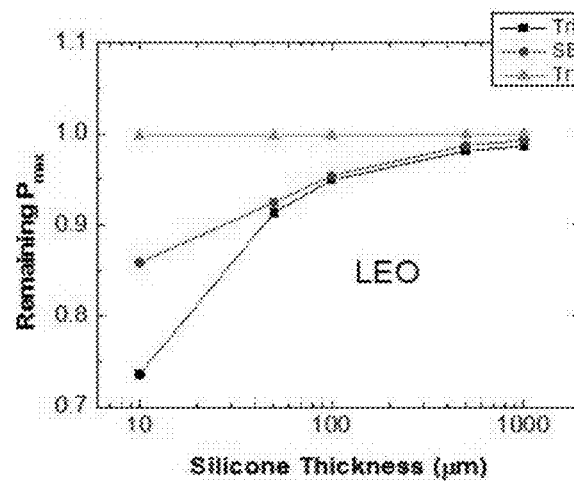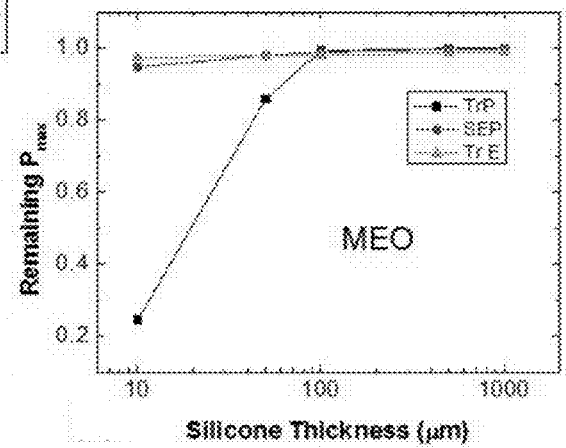
FIGURE 23A  FIGURE 23B
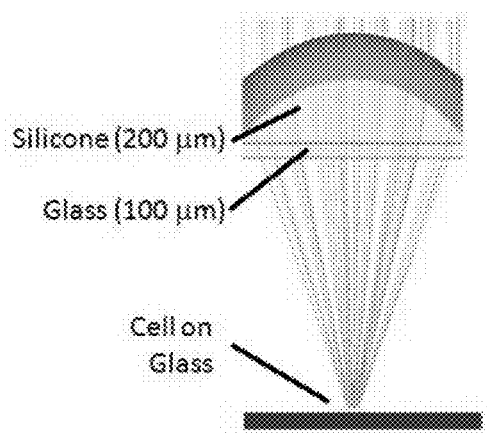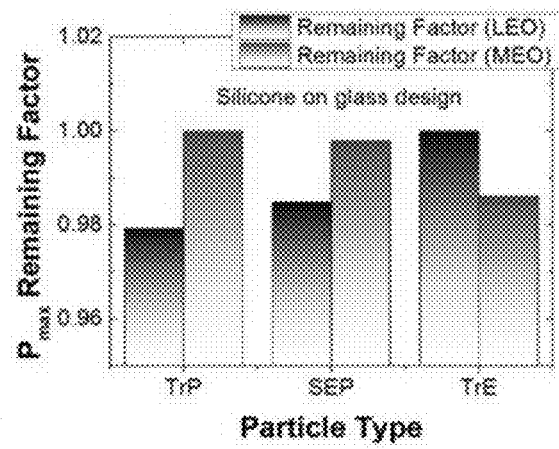
FIGURE 23C  FIGURE 23D

WAFER-INTEGRATED, ULTRA-LOW PROFILE CONCENTRATED PHOTOVOLTAICS (CPV) FOR SPACE APPLICATIONS

CLAIM OF PRIORITY

This application claims priority from U.S. Provisional Patent Application No. 62/236,325 entitled "WAFER-INTEGRATED, ULTRA-LOW PROFILE CONCENTRATED PHOTOVOLTAICS (CPV) FOR SPACE APPLICATIONS" and filed Oct. 2, 2015, in the United States Patent and Trademark Office, the disclosure of which is incorporated by reference herein in its entirety.

RELATED APPLICATIONS

The present application is related to U.S. patent application Ser. No. 14/211,708 entitled "HIGH EFFICIENCY SOLAR RECEIVERS INCLUDING STACKED SOLAR CELLS FOR CONCENTRATOR PHOTOVOLTAICS" filed Mar. 14, 2014, and U.S. patent application Ser. No. 13/100,774 entitled "OPTICAL SYSTEMS FABRICATED BY PRINTING-BASED ASSEMBLY" filed May 4, 2011, in the United States Patent and Trademark Office. This application is also related to U.S. patent application Ser. No. 14/683,498 entitled "MULTI-JUNCTION POWER CONVERTER WITH PHOTON RECYCLING" and filed Apr. 10, 2015, and U.S. Provisional Patent Application No. 62/234,305 entitled "MULTI-JUNCTION PHOTOVOLTAIC MICRO-CELL ARCHITECTURES FOR ENERGY HARVESTING AND/OR LASER POWER CONVERSION" and filed Sep. 29, 2015, in the United States Patent and Trademark Office. The disclosures of the above applications are incorporated by reference herein in their entireties.

STATEMENT OF GOVERNMENT INTEREST

The present invention was funded in-part by the U.S. Air Force Research Laboratory under SBIR Contract No. FA9453-15-0500. The government may have rights in the present invention.

FIELD

The present invention relates to solar or photovoltaic power generation, and more particularly, to concentrated photovoltaic (CPV) power generation.

BACKGROUND

Concentrator photovoltaics (CPV) is a promising technology for renewable electricity generation in sunny environments. CPV uses relatively inexpensive, efficient optics to concentrate sunlight onto solar cells, thereby reducing the cost requirements of the semiconductor material and enabling the economic use of the most efficient cells, for example multi junction solar cells. This high efficiency at reduced costs, in combination with other aspects, makes CPV among the most economical renewable solar electricity technology in sunny climates and geographic regions.

Concentrator photovoltaic solar cell systems may use lenses or mirrors to focus a relatively large area of sunlight onto a relatively small solar cell. The solar cell can convert the focused sunlight into electrical power. By optically concentrating the sunlight into a smaller area, fewer and smaller solar cells with greater conversion performance can be used to create more efficient photovoltaic systems at lower cost.

For example, CPV module designs that use small solar cells (for example, cells that are smaller than about 4 mm$^2$) may benefit significantly because of the ease of energy extraction from such cells. The superior energy extraction characteristics can apply to both usable electrical energy and waste heat, potentially allowing a better performance-to-cost ratio than CPV module designs that use larger cells. To increase or maximize the performance of concentrated photovoltaic systems, some existing CPV systems can be mounted on a tracking system that aligns the CPV system optics with a light source (typically the sun) such that the incident light is substantially parallel to an optical axis of the concentrating optical elements, to focus the incident light onto the photovoltaic elements.

Some designs and processes for making micro-concentrator solar modules are described in U.S. Patent Application Publication No. 2008/0121269. Also, some methods for making concentrator photovoltaic modules, receivers, and sub-receivers are described in U.S. Pat. No. 7,972,875 and U.S. Patent Application Publication No. 2010/0236603. Some space-based power generation is described in U.S. Pat. Nos. 5,498,297; 4,069,812; 4,711,972; 6,031,179; 6,075,200; and 8,974,899.

SUMMARY

According to some embodiments, a concentrator-type photovoltaic (CPV) module includes a plurality of photovoltaic cells (also referred to herein as 'solar cells') having respective surface areas of less than about 4 square millimeters (mm) electrically interconnected in series and/or parallel on a backplane surface, and an array of concentrating optical elements that each have aperture dimensions (such as diameters) of less than about 30 mm and a focal length of less than about 50 mm. The array of concentrating optical elements is integrated on the backplane surface (for example, physically or chemically adhered or otherwise attached thereto) by at least one spacer structure on the backplane surface.

In some embodiments, the array is positioned over the photovoltaic cells such that the concentrating optical elements are spaced apart from the photovoltaic cells based on their respective focal lengths. The array of concentrating optical elements is configured to concentrate incident sunlight on the photovoltaic cells with an absence of air therebetween, for example, in a vacuum condition and/or in an outer space environment.

In some embodiments, the array of concentrating optical elements may be integrated on the backplane surface such that there is an absence of air in at least one optical path between at least one of the concentrating optical elements and at least one of the photovoltaic cells.

In some embodiments, the array of concentrating optical elements may be adhered to the backplane surface such that respective optical paths between the concentrating optical elements and the photovoltaic cells, including the at least one optical path, are free of respective air or vacuum interfaces.

In some embodiments, the array of concentrating optical elements may include a silicone layer having a thickness corresponding to the respective focal lengths of the concentrating optical elements.

In some embodiments, the array of concentrating optical elements may be implemented by glass optical elements on the silicone layer opposite the photovoltaic cells, or by silicone optical elements in or on the silicone layer opposite the photovoltaic cells. The silicone optical elements can include an optical coating thereon comprising a thin film dielectric layer that is configured to reflect portions of the incident light in an ultraviolet wavelength range away from the silicone optical elements. In some embodiments, the optical coating further includes a transparent conductive oxide layer or other transparent conductive layer that is configured to reduce charge accumulation and/or high voltages on surfaces of the photovoltaic cells relative to a surrounding environment, e.g., parts of a spacecraft or solar array.

In some embodiments, the backplane surface comprises a surface of the array of concentrating optical elements.

In some embodiments, the at least one spacer structure may be a plurality of spacer structures adhered to the backplane surface and protruding therefrom between ones of the photovoltaic cells. The spacer structures may suspend the array of concentrating optical elements over and spaced apart from the backplane surface at a distance corresponding to the respective focal lengths such that respective optical paths between ones of the concentrating optical elements and the ones of the photovoltaic cells comprise respective air or vacuum interfaces.

In some embodiments, the array of concentrating optical elements may be implemented by glass optical elements spaced apart from the photovoltaic cells by the respective air or vacuum interfaces, or by silicone-on-glass optical elements spaced apart from the photovoltaic cells by the respective air or vacuum interfaces. The silicone-on-glass optical elements may include a thin film dielectric layer thereon that is configured to reflect portions of the incident light in an ultraviolet wavelength range away from the silicone-on-glass optical elements. In some embodiments, a transparent conductive oxide layer or other transparent conductive layer may be provided on the silicone surfaces of the silicone-on-glass optical elements.

In some embodiments, the spacer structures may be formed from an optically transparent material, and may be arranged between a subset of the concentrating optical elements and a subset of the photovoltaic cells on the backplane surface such that respective optical paths therebetween are free of the respective air or vacuum interfaces.

In some embodiments, the spacer structures may be configured to transition between a collapsed state and an expanded state. For example, the spacer structures may comprise a spring or shape memory alloy. In the expanded state, the spacer structures may position the array of concentrating optical elements over and spaced apart from the backplane surface at the distance corresponding to the respective focal lengths. In the collapsed state, the spacer structures may position the array of concentrating optical elements closer to the backplane surface than the expanded state.

In some embodiments, the spacer structures may be shaped to direct a portion of the incident sunlight onto the photovoltaic cells and/or may be shaped to self-center the concentrating optical elements over respective ones of the photovoltaic cells on the backplane surface.

In some embodiments, the backplane surface may include one or more elements thereon that are configured to absorb portions of the incident sunlight that are not concentrated on the photovoltaic cells by the concentrating optical elements. For example, the one or more elements may include a layer of photovoltaically active material and/or a plurality of non-concentrator photovoltaic elements arranged between respective photovoltaic cells on the backplane surface.

In some embodiments, the array of concentrating optical elements may be formed of space grade silicone and polyhedral oligomeric silsesquioxane (POSS), a gradient index material such that opposing surfaces of the array are substantially planar, and/or comprise a thickness that is sufficient to provide radiation shielding of the photovoltaic cells with respect to the incident light.

In some embodiments, one or more of the photovoltaic cells may be a multi-junction solar cell including a plurality of photovoltaic cell layers that are mechanically stacked to collectively provide a voltage that is greater than a photon energy of the illumination by the sunlight that is incident on one of the photovoltaic cell layers.

In some embodiments, the array of concentrating optical elements may be flexible to bending in at least one dimension, and the backplane surface may be a flexible substrate including the photovoltaic cells thereon that is flexible to bending in the at least one dimension, such that the module may be configured to be stowed in a rolled-up or folded fashion.

According to further embodiments, a concentrator-type photovoltaic module includes a plurality of photovoltaic cells on a flexible backplane surface and electrically interconnected in series and/or parallel thereon, and a concentrating optical element including a silicone layer that defines a flexible lens array integrated on the flexible backplane surface (for example, physically or chemically adhered or otherwise attached thereto) over the photovoltaic cells. The flexible lens array is configured to concentrate incident sunlight on the photovoltaic cells with an absence of air therebetween.

In some embodiments, the module may include an air or vacuum interface in an optical path between the flexible lens array and the photovoltaic cells. The air or vacuum interface may be configured to cause refraction of the incident sunlight that is output from a back surface of the flexible lens array and is directed toward the photovoltaic cells.

In some embodiments, the photovoltaic cells may be directly on a surface of the flexible lens array such that an optical path between the flexible lens array and the photovoltaic cells is free of an air or vacuum interface.

In some embodiments, the surface of the flexible lens array including the photovoltaic cells thereon may define the flexible backplane surface, and conductive terminals of the photovoltaic cells may be contacted opposite the surface of the flexible lens array.

In some embodiments, a plurality of spacer structures may protrude from the backplane surface between ones of the photovoltaic cells to support the flexible lens array. The spacer structures may be formed of a material that is configured to be compressed when the module is stowed in a rolled-up or folded fashion.

In some embodiments, the flexible lens array may include optical elements having respective apertures of less than about 30 mm and respective focal lengths of less than about 50 mm that define an F number greater than about 2.

According to some embodiments, a concentrator-type photovoltaic (CPV) module includes a plurality of photovoltaic cells (also referred to herein as 'solar cells') having respective surface areas of less than about 4 square millimeters (mm) electrically interconnected in series and/or parallel on a backplane surface, and an array of concentrating optical elements that each have aperture dimensions (such as diameters) of less than about 30 mm and a focal length of less than about 50 mm. The array of concentrating optical elements is positioned over the photovoltaic cells thereon based on the respective focal lengths to concentrate incident light on the photovoltaic cells, and is integrated on the backplane surface to define an air or vacuum interface between the concentrating optical elements and the photovoltaic cells. The air or vacuum interface is configured to cause refraction of the incident light that is output from the concentrating optical elements and is directed toward the photovoltaic cells. In some embodiments, at least one spacer structure may position the array of concentrating optical elements over the photovoltaic cells to define the air or vacuum interface therebetween.

According to still further embodiments, a method of fabricating a concentrator-type photovoltaic module includes providing a plurality of photovoltaic cells having respective surface areas of less than about 4 square millimeters (mm) on a backplane surface with series and/or parallel electrical connections therebetween, and providing an array of concentrating optical elements having respective aperture dimensions of less than about 30 mm and respective focal lengths of less than about 50 mm integrated on the backplane surface and positioned over the photovoltaic cells thereon based on the respective focal lengths by at least one spacer structure on the backplane surface.

In some embodiments, the array of concentrating optical elements may be configured to concentrate incident sunlight on the photovoltaic cells with an absence of air therebetween.

In some embodiments, the method may further include electrically testing the photovoltaic cells to identify electrical defects in the series and/or parallel electrical connections, and repairing the electrical defects by physically disconnecting unwanted electrical paths (i.e., shunted or shorted cells) or by adding electrically conductive materials to eliminate unwanted electrical separations (i.e., breaks in the backplane circuit caused by defective cells or contacts) between electrical nodes on the backplane surface. For example, the unwanted electrical paths can be physically disconnected by laser ablation. Additionally or alternatively, the electrical connections can be formed across the defective electrical node separations by laser induced chemical vapor deposition of metals and/or by ink jet printing of colloidal metal inks.

In some embodiments, the series or parallel electrical interconnections may include a blocking diode and/or a fuse in series with one or more of the photovoltaic cells.

In some embodiments, the photovoltaic cells may be printed on the backplane surface using transfer printing techniques. The photovoltaic cells may have respective thicknesses of about 20 micrometers ($\mu$m) or less and may have a coefficient of thermal expansion different from that of the backplane surface.

In some embodiments, the concentrating optical elements may be spherical lenses, and providing the array of concentrating optical elements may include providing an array of spacer features on the backplane surface, and assembling the array of concentrating optical elements by self-centering the spherical lenses in the array of spacer features on the backplane.

In some embodiments, a thickness of the backplane surface and/or a material of the array of concentrating elements may be flexible to bending in at least one dimension such that the module may be configured to be stowed in a rolled-up or folded fashion.

According to still further embodiments, a concentrator-type photovoltaic module, includes a silicon wafer with a thickness between about 1 micrometer ($\mu$m) and about 1 millimeter (mm) (for example, as thin as about 20 $\mu$m), an insulating oxide layer on an upper surface of the wafer, an array of photovoltaic cells electrically interconnected by thin film metallization on the insulating oxide layer, and a micro-lens array on the upper surface of the silicon wafer with the array of photovoltaic cells therebetween. The array of photovoltaic cells defines a square lattice, a rectangular lattice, or a hexagonal lattice having a footprint with dimensions as small as 10 $\mu$m or as large as 20 mm.

In some embodiments, the micro-lens array may be implemented by glass, and may further include one or more layers of silicone that fill a space between the micro-lens array and the upper surface of the silicon wafer.

In some embodiments, micro-lens array may be implemented by gradient index materials that provide different refractive indices by changing the loading fraction of high index nanoparticles. For example, the gradient index materials may include nano-composite inks that may be 3D printed to define volumetric gradients.

In some embodiments, the micro-lens array may be implemented by glass and may be suspended above the upper surface of the silicon wafer by a spacer fixture. Respective lenses of the micro-lens array may be physically separated from underlying ones of the photovoltaic cells with an air or vacuum gap therebetween.

In some embodiments, the micro-lens array may be implemented by a silicone lens array on a glass substrate. The silicone lens array on the glass substrate may be suspended above the upper surface of the silicon wafer and comprises an array of Fresnel lenses.

In some embodiments, the'micro-lens array may be implemented by molded silicone that is physically and/or chemically adhered to the upper surface of the silicon wafer including the array of photovoltaic cells thereon such that the molded silicone encapsulates the photovoltaic cells for protection from a surrounding environment. An exterior surface of the molded silicone may be coated with a thin film dielectric coating that is configured to reflect light in an ultraviolet wavelength range of less than about 350 nm away from the micro-lens array, but is configured to transmit light in a wavelength range of about 350 nm to 2000 nm therethrough.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

The patent or application file contains at least one drawing executed in color. Copies of this patent or patent application publication with color drawings will be provided by the Office upon request and payment of the necessary fee.

FIGS. 3A and 3B illustrate examples of plano-convex (PCX) lenses that may be used as concentrating optical elements according to some embodiments described herein.

FIG. 4 illustrates an example of an array of single-stage lenslet concentrators (shown as plano-convex lenses) that may be used as concentrating optical elements according to some embodiments described herein.

FIGS. 14A-14C illustrate elements of microscale CPV for space applications and FIG. 14D illustrates a process of micro-transfer printing according to some embodiments described herein.

FIGS. 21A-21B illustrate modeled performance of a 6-junction solar cell under LILT conditions according to some embodiments described herein.

FIGS. 22A-22B illustrate simulation results for electron and proton spectra in two canonical orbits (LEO, MEO) after passing through radiation shielding provided by a CPV-CIC in accordance with some embodiments described herein.

FIGS. 23A-23D illustrate modeled EOL residual power output of space CPV cell designs using silicone optics for two different canonical orbits (LEO, MEO) in accordance with some embodiments described herein

DETAILED DESCRIPTION OF EMBODIMENTS

Figure 1:
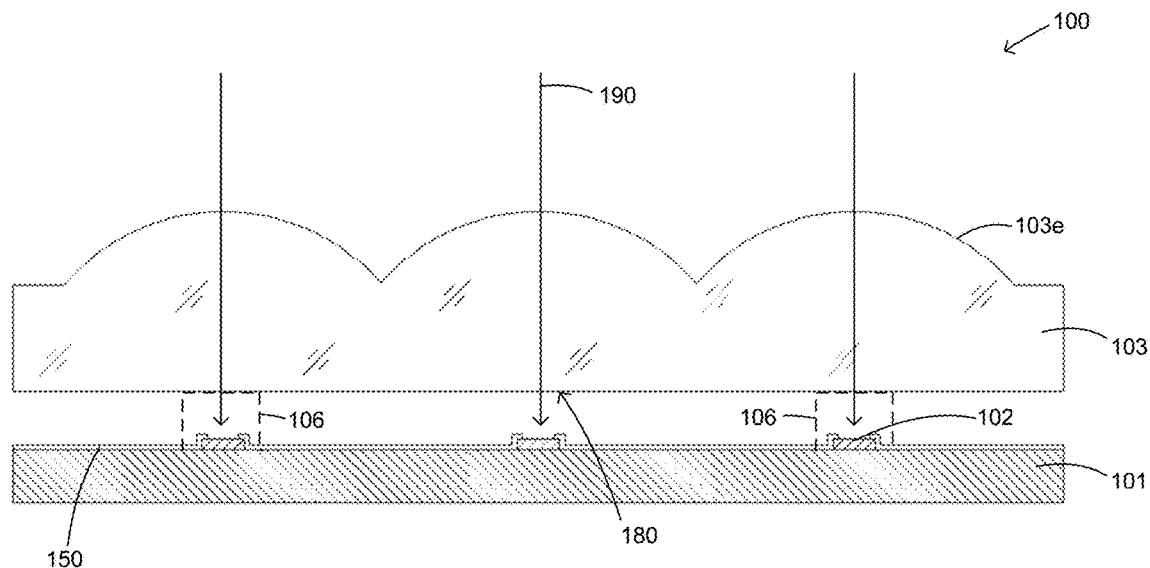
FIG. 1 illustrates a CPV module according to some embodiments described herein.

Embodiments described herein can provide lightweight, low-profile concentrator photovoltaic (CPV) modules, for use, for example, in extra-terrestrial, interplanetary, or outer space (generally referred to herein as "space") applications. Such embodiments include methods of integrating optical concentration in the form of a microlens array directly onto a wafer or other backplane surface by providing a lightweight lens array on top of a wafer including photovoltaic cells thereon to produce a lower cost substitute for coverglass-integrated cells (CICs), for example, by molding a PCX microlens array out of silicone and attaching the microlens array directly to the wafer. In some embodiments, respective optical paths between some (or all) of the lenses and the photovoltaic cells may be free of air or vacuum interfaces. Embodiments described herein can also provide a microlens array having short focal lengths (for example, of about 10 millimeters or less) with a desired F number (for example, greater than 2), allowing the photovoltaic cells to be placed closer to the microlens array to reduce or minimize spacing between while providing the photovoltaic cells at or near the focal lengths of the lenses.

Some embodiments described herein can also provide solar cells for use in space that can enable multiple order of magnitude cost reduction while increasing efficiency per unit area of the space solar array. Such solar cells may include multi junction solar cells, as described for example in U.S. patent application Ser. No. 14/683,498, entitled "MULTI-JUNCTION POWER CONVERTER WITH PHOTON RECYCLING" filed Apr. 10, 2015, which is incorporated by reference herein in its entirety.

Some embodiments described herein can further provide a flexible microlens array, formed of materials that reduce or minimize outgassing, so as to avoid degradation in space. When combined with flexible backplane materials, such embodiments can enable flexible CPV modules, which may be deployed in a flat or planar configuration while in operation, but can be stowed in a rolled-up or folded fashion.

Some embodiments described herein include design concepts which can allow optical concentration to be integrated with high efficiency III-V photovoltaics at the wafer level to produce a modular product whose form factor closely resembles those of CICs, which may be used in some conventional solar arrays for space applications. In particular, embodiments described herein combine advances in the disparate fields of micro-transfer printing (which can allow high efficiency solar cells to be integrated onto a non-native substrate wafer such that the wafer can be sparsely populated with high efficiency solar cells) and flexible coverglass replacement materials (which can be molded into microlens arrays that are suited for integration onto a wafer that carries a field or array of micro-transfer printed solar cells).

Some embodiments described herein may arise from realization that, in a concentrator-type photovoltaic (CPV) module, reducing or eliminating the air interface between the solar cells and the concentrating optical elements may provide several advantages. For example, embodiments described herein may provide concentrator photovoltaic modules that can be more densely-packed in applications where physical space is a concern, due to a reduced or eliminated intra-module air-content between the solar cell and the concentrator lens array. It will be understood that descriptions herein of air content/interfaces may refer to both an air interface (when the module is on Earth) and a vacuum interface (when the module is in space). Reduction or elimination of the air/vacuum gap between the solar cells and the concentrator lens array can also allow for higher overall optical efficiency, by reducing or eliminating reflection losses at the optical interfaces therebetween. In addition, further embodiments described herein may provide concentrator photovoltaic modules that have reduced risk for internal condensation problems and/or concentrator photovoltaic modules with improved thermal dissipation, due to the reduction or elimination of the air interface.

Embodiments described herein may thus provide devices or modules that reduce or eliminate air or empty space (vacuum) between the primary lens and the solar cell, to reduce outgassing concerns and/or to increase the structural rigidity to withstand launch shock and vibration. In particular embodiments, the primary lens includes an array of concentrating optical elements that is integrated onto the backplane such that there is an absence of air in an optical path between at least one of the concentrating optical elements and at least one of the photovoltaic cells. For example, the array of concentrating optical elements may have a sufficient thickness such that the array of concentrating optical elements is placed directly on the photovoltaic cells at or near the respective focal lengths of the concentrating optical elements, such that respective optical paths between the concentrating optical elements and the photovoltaic cells are free of air or vacuum interfaces. One or more transparent spacer structures may be placed directly on a corresponding one or more of the photovoltaic cells, where such photovoltaic cell(s) include the transparent spacer structure(s) so that respective optical path(s) between such photovoltaic cell(s) and the corresponding concentrating optical elements are free of air or vacuum interface(s), while respective optical path(s) between other photovoltaic cell(s) and the corresponding concentrating optical elements include air or vacuum interface(s). In addition, some embodiments described herein may provide devices or modules in which solar cells are mechanically stacked to achieve increased conversion efficiency in space environments.

Embodiments described herein also provide CPV devices or modules which can yield improved radiation shielding to the solar cells. For example, the solar cells can be mounted, attached, or otherwise provided directly onto a surface of the lens array opposite the concentrating elements, where the lens array has a thickness and/or coating that is sufficient to reduce the effects of radiation on the solar cells. Due to the increased efficiency of the concentrator-type designs described herein, the thickness (and thus mass) of the lens array can be increased to provide the improved shielding without increasing (or holding constant) the watts per kilogram (W/kg) of the array. The lens array may therefore effectively serve as an encapsulant of the solar cells for protection from the surrounding environment, without the weight penalty that may be imposed if implemented in a non-concentrating type CIC.

Some embodiments described herein may provide space solar cell devices or modules which can allow ultra-thin cells (e.g., 20 micrometers (μm) thick or less) to be integrated onto substrates whose coefficient of thermal expansion may be significantly different from that of the solar cells, with reduced or no risk of the cells breaking or delaminating under thermal cycling. The use of relatively small cells (e.g. with dimensions of about 4 square millimeters or less) can enable this robustness.

As described herein, a CPV receiver may include a solar cell (also referred to herein as a photovoltaic (PV) cell or CPV cell) having a light-receiving surface area of about 4 $mm^2$ or less, concentrating optical elements (also referred to herein as concentrator optics, concentrating optics, or optical concentrators), associated support structures, and conductive structures for electrical connection to a backplane or other common substrate. The concentrator optics may include a primary lens element (for example, a Fresnel lens, a plano-convex lens, a double-convex lens, a crossed panoptic lens, and/or arrays thereof) and/or a secondary lens element (for example, placed or otherwise positioned on or adjacent to the light receiving surface of the solar cell). The primary lens element may be positioned over the secondary lens element to direct incident light thereto. As described herein, incident light is received at and/or enters a 'front' surface of a lens element, while the light is output from a 'back' surface (which is opposite the front surface) of the lens element. Similarly, the 'front' surface of a solar cell refers to its light receiving surface, while the 'back' surface of the solar cell is opposite the front surface.

FIG. 1 illustrates a CPV module 100 according to some embodiments described herein. Referring now to FIG. 1, the CPV module 100 includes a concentrating optical element 103 in the form of a lens array, a plurality of CPV cells 102, and a backplane or other substrate 101 including electrically conductive elements 150 therein or thereon. The concentrating optics 103 include an air or vacuum interface 180 in respective optical paths 190 between the respective lens elements 103e of the array 103 and corresponding ones of the CPV cells 102, which are aligned with the respective lens elements 103e. The air or vacuum interface 180 causes a bending of incident light by refraction as it is output from the back surface of the lens array 103, which is accounted for in the design of the array 103 and/or the placement of the CPV cells 102 such that the incident light is directed toward the CPV cells 102. The air or vacuum interface 180 may be defined by one or more spacer structures 106 that attach or otherwise integrate the lens array 103 onto the surface of the backplane 101 and separate the lens array 103 from the surface of the backplane 101 based on the focal lengths of the concentrating optical elements. In some embodiments, the spacer structures 106 may be formed of a transparent material, such as silicone, that is mounted or attached directly on respective ones of the CPV cells 102, such that some optical paths 190 do include the air or vacuum interface 180. In the embodiment of FIG. 1, both conductive terminals of the CPV cells 102 are contacted from the top side. In some embodiments, the lens array 103 may be formed of a glass lens element, or a silicone-on-glass lens element, as described in greater detail below. The use of silicone in lens arrays and/or other concentrating optical elements described herein may refer to space-grade silicone, to reduce or avoid the effects of outgassing on the optical clarity of the lens array when the module is deployed for longer durations, for example, in outer space.

Figure 2:
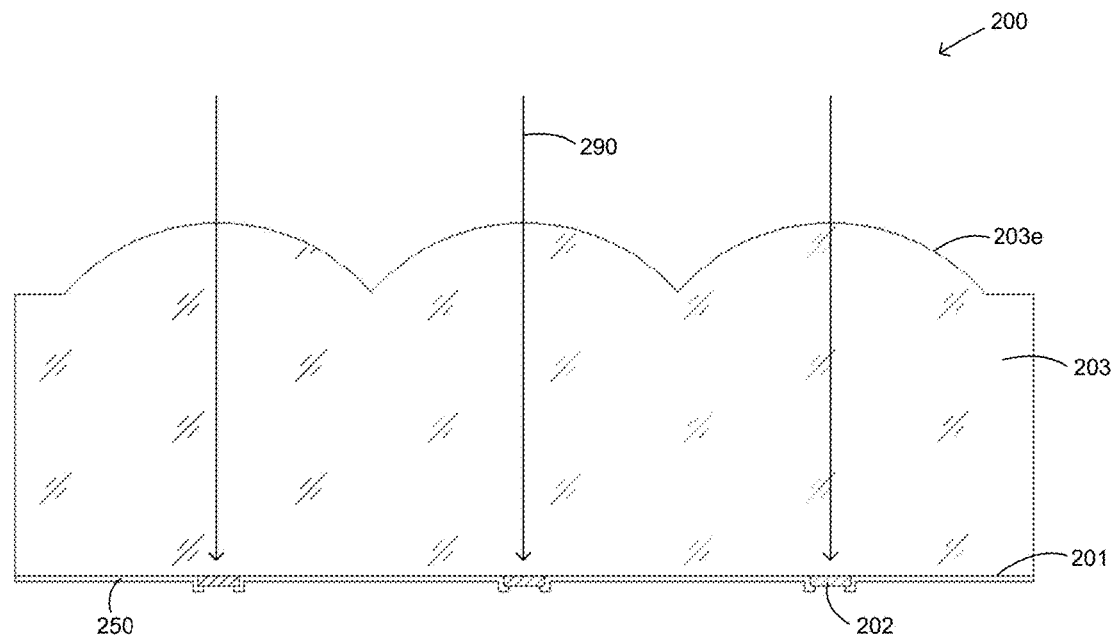
FIG. 2 illustrates a CPV module according to further embodiments described herein.

FIG. 2 illustrates a CPV module 200 according to further embodiments described herein. Referring now to FIG. 2, the CPV module 200 includes a concentrating optical element 203 in the form of a lens array, a plurality of CPV cells 202 on a back surface of the lens array 203 and aligned with the respective lens elements 203e. The CPV cells 202 are electrically connected by conductive elements 250 on the back surface 201. The CPV cells 202 are integrated directly onto the back surface of the lens array 203, such that the respective optical paths 290 between the lens elements 203e of the array 203 and the corresponding CPV cells 202 aligned therewith are free of air or vacuum interfaces. That is, the thickness of the lens array 203 may effectively function as a spacer structure for the entirety of the lens array 203, to position the CPV cells 202 at a distance at or near the focal length of the individual lens elements 203e. In the embodiment of FIG. 2, both conductive terminals of the CPV cells 202 are contacted from the bottom side. In this example, the back surface of the lens array 203 functions as the backplane surface (designated by element 101 in FIG. 1). In some embodiments, the lens array 203 may be formed of a glass lens element on a silicone layer, or may be formed solely of silicone (e.g., molded silicone) or from a layer of gradient index material (which provide different refractive indices by changing the loading fraction of high index nanoparticles), as described in greater detail below.

As noted above, in the embodiment of FIG. 2, the CPV module 200 includes no air between the CPV cells 202 and the back surface of the concentrating optics lens array 203. The reduction and/or elimination of the air or vacuum interfaces between the concentrating optics 203 and the CPV cells 202 may provide enhanced thermal dissipation from the backplane 201 by direct heat conduction and radiation and convection from both sides of the module 200. The absence of air or vacuum interfaces may also provide benefits in outer space applications, such as reduced risk for internal condensation and/or other effects which may detract from the optical efficiency and/or lifetime of the module 200.

FIGS. 3A and 3B illustrate examples of plano-convex (PCX) lenses that may be used as concentrating optical elements according to some embodiments described herein. FIG. 3A illustrates a plano-convex lens 303a in which the solar cells are placed at the second or back surface of the lens 303a (as shown in FIG. 2B), such that there is no air in the optical path between first or front surface of the lens 303a and the solar cell. FIG. 3B illustrates a plano-convex lens 303b positioned relative to the solar cell such that the second or back surface of the lens is physically separated from the solar cell by an air gap (as shown in FIG. 2A). In FIG. 3B, the CPV module may benefit from reduced weight, reduced profile height, and improved acceptance angle due to the smaller focal length of the concentrating optical element 303b, which includes two optical surfaces that refract and focus incident light (e.g., sunlight). Such size and/or weight reduction may be of particular importance in space applications.

FIG. 4 illustrates an example of an array 403 of single-stage lenslet concentrators (shown as plano-convex lenses) that may be used as concentrating optical elements according to some embodiments described herein to focus incident sunlight 490 onto a set of positions on a backplane substrate 401. An array of solar cells can be positioned or arranged according to the set of positions at or near the focal lengths of the lenses of the array 403 to efficiently convert the sunlight 490 into electrical energy. At least a portion of the incident rays of sunlight 490 are refracted at both the first/front and second/back surfaces of the lenses 403. In some embodiments, a transparent planar or flat plate 470 may be used to cover the curved surface of the concentrating optics 403 to provide protection (for example, from soiling). Although illustrated in FIG. 4 as a single-stage design, in some embodiments, the CPV module 400 may include multi-stage concentrating optics, with the illustrated array of primary concentrating optics 403 aligned with and configured to concentrate light 490 onto an array of secondary or tertiary concentrating optics.

Figure 5B:
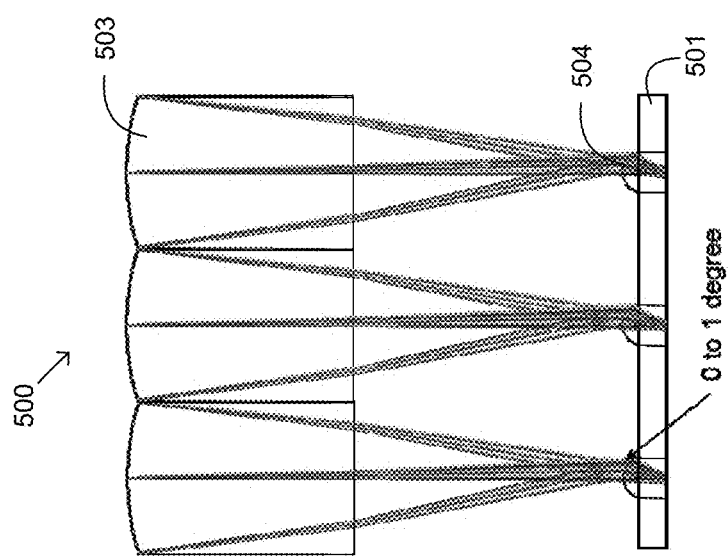
FIGS. 5A and 5B illustrate a CPV module including two-stage (e.g., primary and secondary) concentrator optics according to some embodiments described herein.
Figure 5A:
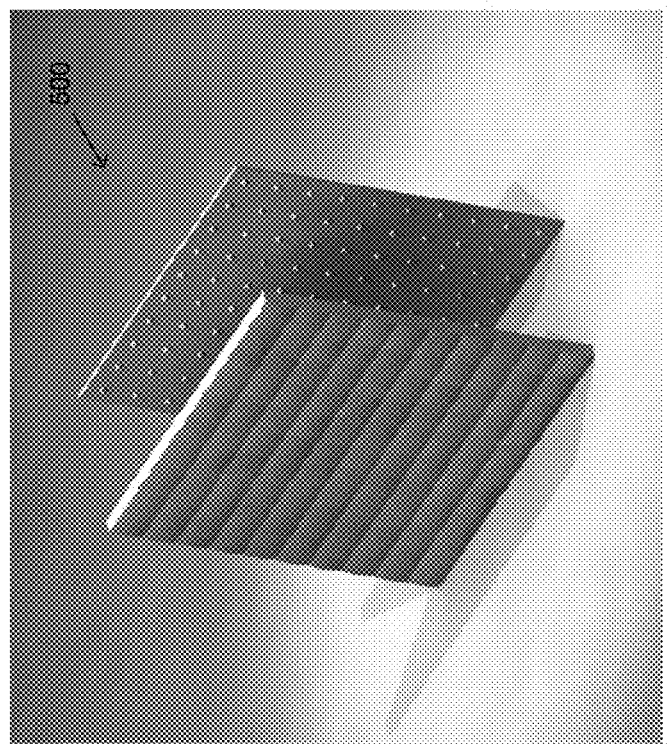

FIGS. 5A and 5B illustrate a CPV module 500 including two-stage (e.g., primary 503 and secondary 504) concentrator optics. Both optical stages 503, 504 include arrays of refractive optical elements that are configured to be registered or aligned to an array of cells to focus incident light thereon. The arrays of concentrating optical elements 503, 504 may be produced by molding optical materials (as shown for example by the lens array 503) or assembly of individual optical elements (as shown for example by the individual optical elements 504). In some embodiments, a distance from a solar cell to the farthest surface of the concentrating optics (e.g., the front surface of the primary optical element 503) is less than about 10 millimeters. While further embodiments are described hereinafter primarily with reference to single-stage concentrator optics, it will be understood that such embodiments may be modified to include multi-stage concentrating optics as shown in the examples of FIGS. 5A and 5B.

Figure 6A:
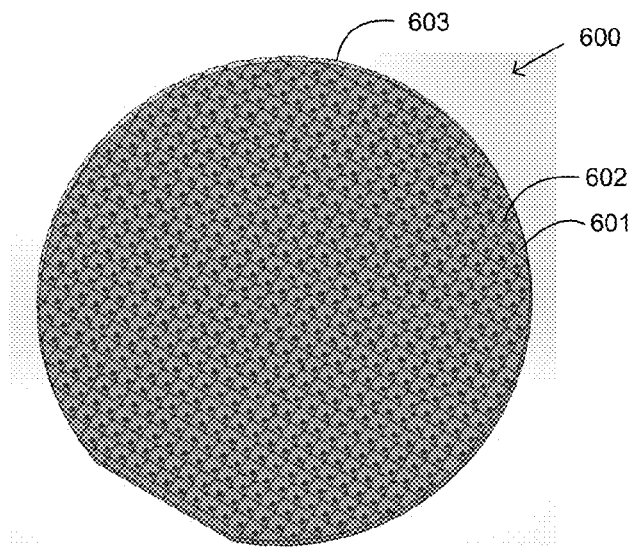
FIGS. 6A to 6G illustrate CPV modules including integrated concentrating optics and related components in accordance with some embodiments described herein.
Figure 6B:
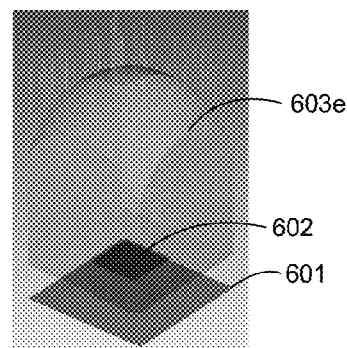
Figure 6C:
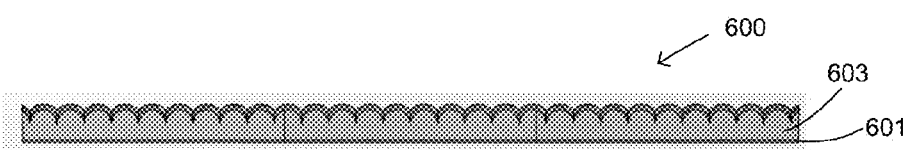
Figure 6D:
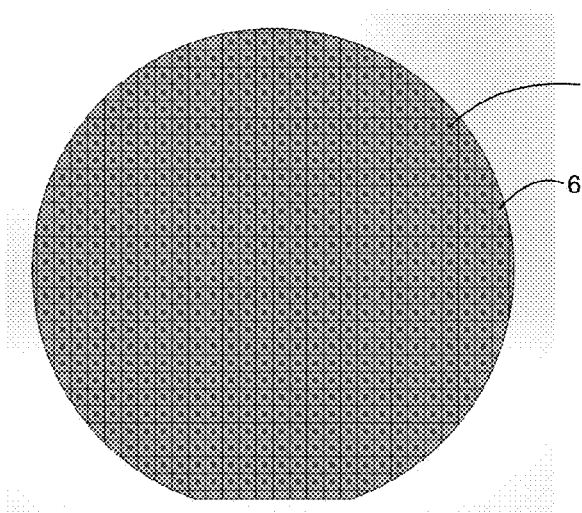
Figure 6E:
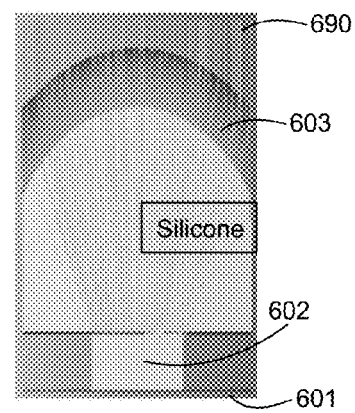
Figure 6F:
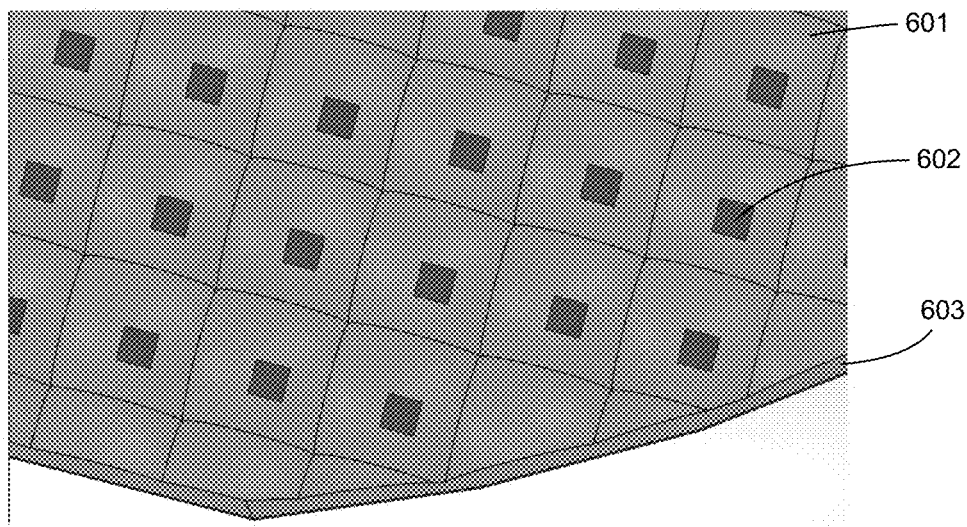
Figure 6G:
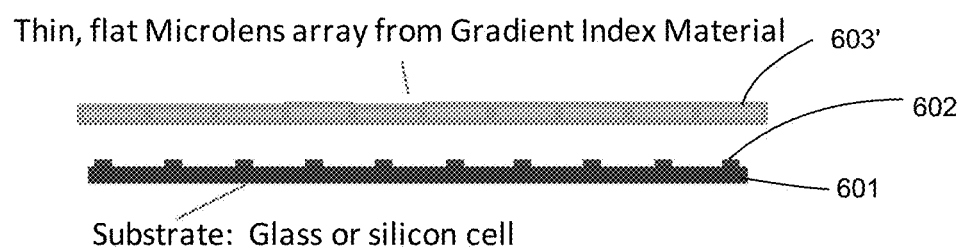

FIGS. 6A to 6G illustrate CPV modules 600 including integrated concentrating optics 603 and related components in accordance with some embodiments described herein. In FIGS. 6A-6F, the array of concentrating optical elements 603 is implemented by one or more layers of molded silicone, referred to herein as a silicone-only design. However, it will be understood that other transparent optical materials (for example, gradient index materials) may be used to implement the array of concentrating optical elements 603 in other embodiments, as shown in FIG. 6G. Also, in some embodiments, the array of concentrating optical elements 603 may be fabricated using three-dimensional (3D) printing techniques, for example, by 3D printing the gradient index materials.

In particular, FIG. 6A is plan view illustrating a wafer 601 including an array of CPV cells 602 and a molded lightweight lens array 603 thereon. The wafer functions as a backplane surface on which the CPV cells are electrically connected (for example, in series or in parallel), and may be a silicon or glass substrate, or even a flexible material substrate in some embodiments. FIG. 6B is an exploded view illustrating an individual molded concentrating optical element 603e of the lens array 603, CPV cell 602, and a portion of the wafer 601. FIG. 6C is a cross sectional view showing the wafer 601 including the molded lightweight lens array 603 thereon. As shown in FIG. 6C, the lens array 603 is adhered or otherwise attached directly to the surface of the wafer 601 that includes the CPV cells thereon, such that respective optical paths between the lenses of the array 603 and the CPV cells are free of air or vacuum interfaces.

FIG. 6D is plan view showing the wafer 601 including the CPV cells 602 thereon, with the lens array 603 removed. The CPV cells 602 may have respective surface areas of about 4 square millimeters (mm) or less and respective thicknesses of about 20 micrometers (μm) thick or less, and may be assembled on the wafer 601 using micro-transfer printing techniques. FIG. 6E is a cross-sectional view showing concentration of incident light 690 on one of the CPV cells 602 by one of the lens elements 603e. FIG. 6F is an enlarged plan view of FIG. 6A, illustrating the lens array 603 on the surface of the wafer 601 with the CPV cells sandwiched therebetween.

Some features of the embodiments shown in FIGS. 6A-6F thus include (i) an array of high efficiency CPV cells 602 on a top surface of a wafer 602 and (ii) the integration of a lightweight lens array 603 on the top surface of the wafer 603 to produce a lower cost substitute for a CIC, which may be conventionally be used in some space power applications. The embodiments shown in FIGS. 6A-6F are based on molding a PCX microlens array 603 out of silicone and mounting the microlens array 603 directly on top of the surface of the wafer 601; however, embodiments described herein are not limited to such an implementation. For example, as shown in FIG. 6G, the array of concentrating optical elements 603' is thin, flat (i.e., having opposing substantially planar surfaces) microlens array formed from gradient index materials, rather than the homogenous silicone material of FIG. 6C. The gradient index materials may include nano-composite inks that provide different refractive indicies by changing the loading fraction of high index nanoparticles, and can be 3D printed (for example, using inkjet technology) to define volumetric gradients. The gradient index materials can thus be printed side-by-side to define the array 603' in a substantially planar form factor.

Figure 7A:
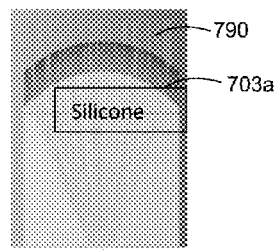
FIGS. 7A-7G are cross-sectional views illustrating some implementations of concentrating optical elements in accordance with embodiments described herein.
Figure 7B:
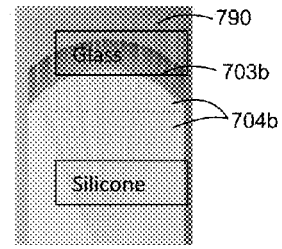

FIGS. 7A-7E are cross-sectional views illustrating some implementations of concentrating optical elements in accordance with embodiments described herein. The embodiments of FIGS. 7A-7E are illustrated with reference to plano-convex (PCX) lens arrays that concentrate incident sunlight 790 onto respective CPV cells defining a CPV array on a backplane surface, but it will be understood that other concentrator optics configurations or elements (for example, Fresnel lenses) may also be used. As shown in FIG. 7A, the PCX lens array includes a lens element 703a implemented by a layer of transparent silicone, referred to herein as a silicone-only lens design. In FIG. 7B, the PCX lens array includes a lens element 703b formed of glass, while a silicone layer 704b is used to fill spaces between the PCX lens array 703b and the array of CPV cells on the wafer or other backplane surface, referred to herein as a glass-on-silicone lens design.

Figure 7C:
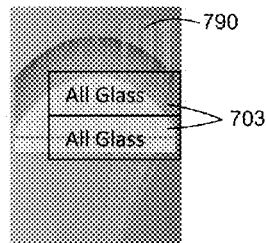

In FIG. 7C, the PCX lens array includes a lens element 703c made of glass that is suspended above the wafer and CPV cell array by an external fixture or by a spacer structure that is integrated into the wafer-plus-microlens array module, referred to herein as an all-glass lens design. Each lens 703c in the array may be physically separated from the underlying CPV cell with an air or vacuum interface between the lens 703c and CPV cell, and the CPV cell can thus obtain extra or additional optical power from the underlying surface, which may be curved or flat.

Figure 7D:
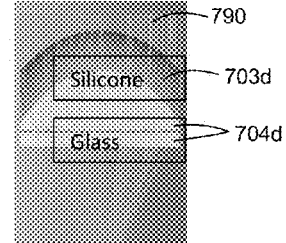

In FIG. 7D, the PCX lens array includes a lens element 703d constructed from silicone, and glass 704d with the silicone PCX lens array molded on to a flat glass substrate, referred to herein as a silicone-on-glass (SOG) lens design. The lens element 703d is suspended above the underlying CPV cell with an air or vacuum interface between the lens 703d and CPV cell, for example, using a spacer structure similar to that described in the embodiment of FIG. 7C, increasing optical power, and removing mass.

Figure 7E:
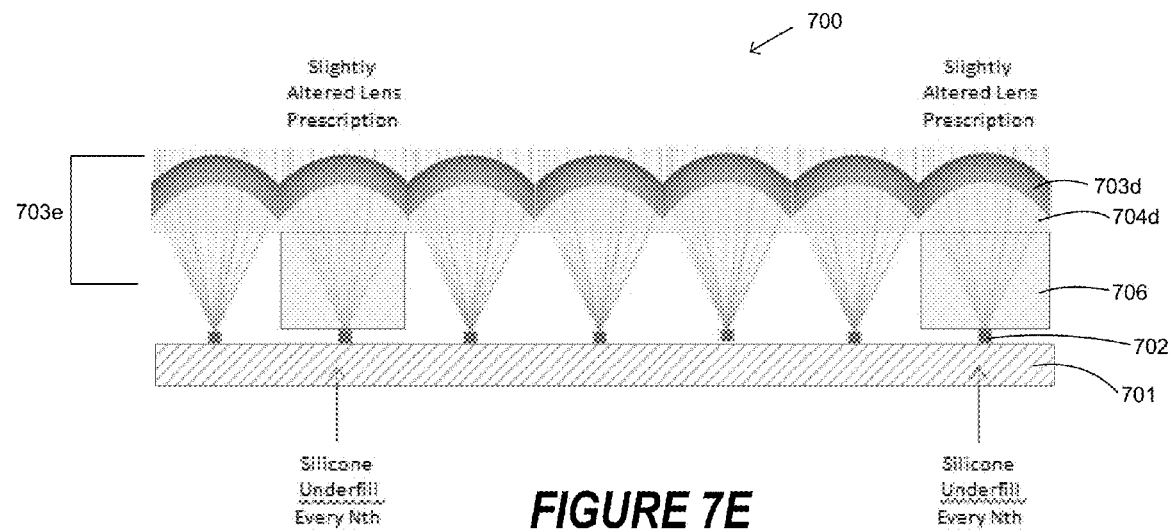

FIG. 7E is a cross-sectional view illustrating a silicone-on-glass (SOG) lens array 703e and spacer structures 706 (illustrated as silicone supports) that suspend the silicone on glass lens array 703e above the surface wafer 701. The lens array 703e may include an array of Fresnel lenses, instead of the illustrated array of plano-convex lenses 703d/704d, in some embodiments. The use of a Fresnel lens array can aid in the reduction of overall mass, making the overall structure significantly lighter.

As shown by way of example with a silicone-on-glass arrangement 703d/704d, the lens array 703e is suspended above the wafer-surface 701 including the array of CPV cells 702 thereon by an array of spacer structures 706, illustrated as silicone "supports" or "studs," protruding from the surface of the wafer 701. The spacer structures 706 integrate or otherwise attach the top of the wafer 701 to the bottom of the lens array 703e. The spacer structures 706 provide mechanical support for and are configured to position the lens array 703 over the surface of the wafer 701 such that the CPV cells 702 are at or near the respective focal lengths of the lens elements 703d. In some embodiments, the spacer structures 706 may be placed in between the underlying CPV cells 702 so as not to obstruct the respective optical paths between the lens elements 703d and the corresponding CPV cells 702.

In the embodiment of FIG. 7E, the spacer structures 706 are positioned directly on a subset of the CPV cells 702 such that the respective optical paths between particular lens elements 703d aligned with the subset of CPV cells 702 are free of air or vacuum interfaces. That is, a subset of the optical paths provided by the lens array 703e may be obstructed or "filled" by the spacer structures 706 that integrate the lens array 703 onto the wafer 701. In doing so, while all of the lenslets 703d of the array 703e may be configured to concentrate incident light onto the CPV cells 702 with an absence of air in their respective optical paths (for example, in space applications), the particular lenslets 703d of the lens array 703e which have a spacer structure 706 in their optical paths are configured with an altered lens prescription relative to the neighboring lenslets 703d that are configured to focus the incident light 790 through a vacuum before intersecting the CPV cells 702.

Figure 7F:
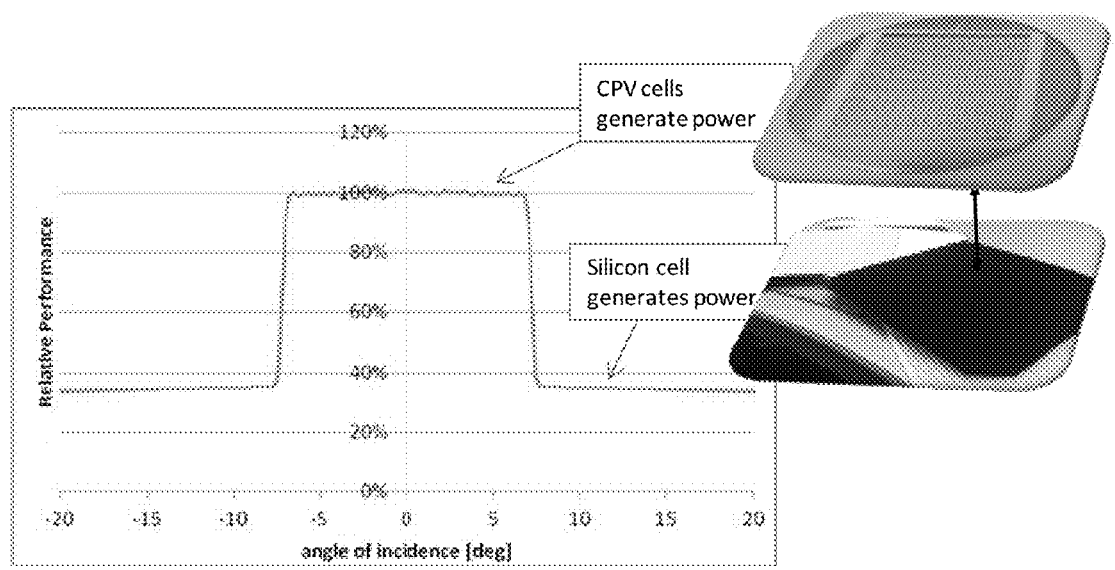

Although described in some embodiments with reference to silicon as a possible material for the wafer 701, further embodiments described herein may use various substrates (besides silicon wafers) as the substrate upon which the array of CPV cells 702 may be assembled. Such other possible materials may include glass, ceramic (e.g. $Al_2O_3$), or polymer substrates (with appropriate coefficients of thermal expansion. In addition, other embodiments may use the underlying substrate as a secondary, "backup" photovoltaic to capture light that is not concentrated on the CPV cells by the lens array 703e, for example when the orientation normal to the sun (referred to as "on-axis" with respect to the optical axes of the lens elements 703d) is lost. In particular, as shown in FIG. 7F, lower cost, larger area, non-concentrator photovoltaic cells can be positioned on the backplane surface 701 between or behind the CPV cells 702, which can allow for collection of such "off-axis" collection of light. Such non-concentrator photovoltaic cells may be implements by thin-film photovoltaic elements, or even by a photovoltaically active substrate (such as a silicon photovoltaic wafer). Providing non-concentrator photovoltaic cells between the CPV cells 702 to allow for collection of off-axis light is further described by way of example in U.S. patent application Ser. No. 14/211,262 entitled POWER AUGMENTATION IN CONCENTRATOR PHOTOVOLTAIC MODULES BY COLLECTION OF DIFFUSE LIGHT" filed Mar. 14, 2014, the disclosure of which is incorporated by reference herein in its entirety.

Figure 7G:
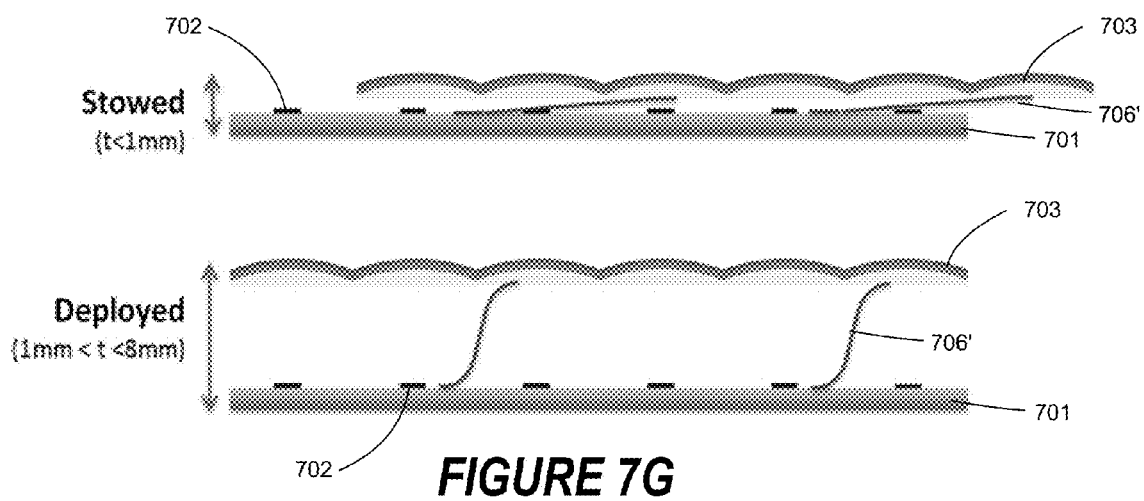

In addition, as shown in FIG. 7G, the lens array 703 may be suspended over the surface of the wafer 701 including the array of CPV cells 702 thereon by spacer structures in the form of deployable support structures 706'. The deployable support structures 706' integrate or otherwise attach the top of the wafer 701 to the bottom of the lens array 703. The deployable support structures 706' may include springs or shape memory alloys that are configured to provide a deformed or collapsed state such that the lens array 703 can be positioned in a stowed configuration relative to the wafer 701 (top of FIG. 7G) and are configured to provide an expanded or open state such that the lens array 703 can be positioned in a deployed configuration relative to the wafer 701 (bottom of FIG. 7G).

As shown in FIG. 7G, in the stowed position or configuration, the combination of the lens array 703 and the wafer 701 including the CPV cells 702 thereon may have a total thickness t of less than about 1 mm. In the deployed position or configuration, the deployable support structures 706' provide mechanical support for and are configured to position the lens array 703 over the surface of the wafer 701 such that the CPV cells 702 are at or near the respective focal lengths of the lens elements 703. In the deployed position, the combination of the lens array 703 and the wafer 701 including the CPV cells 702 thereon may have a total thickness t of greater than about 1 mm and less than about 8 mm. In some embodiments, the deployable support structures 706' may be placed in between the underlying CPV cells 702 so as not to obstruct the respective optical paths between the lens elements 703 and the corresponding CPV cells 702.

The configuration shown in FIG. 7G may be particularly advantageous in applications where reducing or minimizing physical space and weight are of greater importance (such as outer space applications). In particular, in a satellite application, the module may be stored in the satellite in the stowed configuration during launch to reduce the space occupied by the module, and may be opened to the deployed configuration after launch, once the satellite has reached the outer space environment.

Further embodiments described herein may include designs which use other materials for to provide flexible (or non-flexible) micro-cell arrays. One example material is a combination of space grade silicone and polyhedral oligomeric silsesquioxane (PASS). Such alternate polymer materials may be incorporated, for example, into the "silicone-only" embodiments of FIG. 7A, the silicone-on-glass lens arrays of FIG. 7D, and/or other embodiments. In addition, some embodiments described herein may use extremely thin wafer substrates 701 that are formed of flexible materials. When combined with flexible microlens arrays (e.g., those made of silicone, such as in FIG. 7A), portions of or the entire on-wafer CPV assembly 700 may become flexible to bending in at least one dimension, which can permit the assembly 700 to be stowed in a "rolled-up" or "fold-up" configuration in applications where flexibility may be helpful and/or required. While the CPV may not function efficiently while the flexible assembly is stowed, flexibility may confer advantages for stowing in small volumes, with the understanding that the CPV assemblies may be deployed from the stowed configuration (i.e. held flat) while in operation.

In addition, in order to protect the silicone from degradation in the space environment, especially from ultraviolet (UV) light and atomic oxygen degradation, the exterior or outer surface of the silicone lens array may be coated with a thin film dielectric optical coating, such as a UVR/ARC (UV reflector/anti-reflection coating), which is configured to reflect UV light away from the silicone while increasing or maximizing the transmission of visible and near IR wavelengths (e.g. 350 nm to 2000 nm). This coating may or may not also include a transparent conductive oxide layer to confer some conductivity, which can reduce or prevent the build-up of charge and/or high voltages on the surface of the cells relative to surrounding parts of the spacecraft or solar array, where such a voltage or charge accumulation could otherwise result in arcing events.

Particular embodiments described herein may include a single 150 mm silicon wafer with a thickness between 1 micrometer (μm) and 1 millimeter (mm), and with an insulating oxide layer on its upper face. The top of this wafer may be populated with an array of high efficiency CPV solar cells that may be interconnected by thin film metallization. The pitch of the array of solar cells may range from less than 100 μm to 20 mm or more, and the array may be a square lattice, rectangular lattice, hexagonal lattice or other repeating array. Correspondingly, the CPV cells may have a compact footprint with dimensions as small as 10 μm or as large as 20 mm, and their shape may be square, rectangular or hexagonal or other polygon.

In some embodiments, on top of the 150 mm wafer that is populated by electrically interconnected solar cells, a micro-lens array may be provided. The micro-lens array may be made of molded silicone (e.g., polymethyldisiloxane, PDMS) that has been molded in such a way that the center of each lenslet of the micro-lens array is aligned to the center of each CPV cell lying on the wafer below it. The silicone lens array may be in contact with the underlying wafer and cells such that it is physically and/or chemically adhered to the wafer surface, and such that the silicone lens array serves as an encapsulant of the solar cells for protection from the surrounding environment. The optical form of the microlens array may include convex lens surfaces oriented in an outward facing manner (i.e. convex out). These convex silicone surfaces may provide optical power which focuses normally incident (solar) light on to the CPV solar cells lying beneath them. The specific combination of overall silicone thickness, array pitch, and cell size (among other parameters) can dictate the acceptance angle, concentration ratio, cell performance, overall efficiency, and specific power of the design, but embodiments described herein can include any combination of these design dimensions. Embodiments described herein may thus achieve compactness in both size and weight of the array, which may be significant and/or critical to outer space applications.

Accordingly, concentrator optics and substrates that may be used in CPV modules described herein may be implemented by, but are not limited to, configurations including: a glass microlens array on a silicone layer; a glass microlens array suspended over a substrate with a vacuum therebetween; a silicone-on-glass lens array suspended over a substrate with a vacuum therebetween; a hybrid combination of a lens array suspended over a substrate with a vacuum therebetween, with subset of array positions filled with silicone to provide support for the lens array; Fresnel lenslets instead of PCX lenslets; flexible substrates as a backplane surface; non-silicon substrates (e.g., glass, ceramic, polymer, etc.); photovoltaically active substrates (such as a silicon photovoltaic wafer); thin film photovoltaic elements positioned in between CPV cells for off-axis light collection; other polymers (e.g. POSS) for use in the lens array and/or substrate.

Figure 8A:
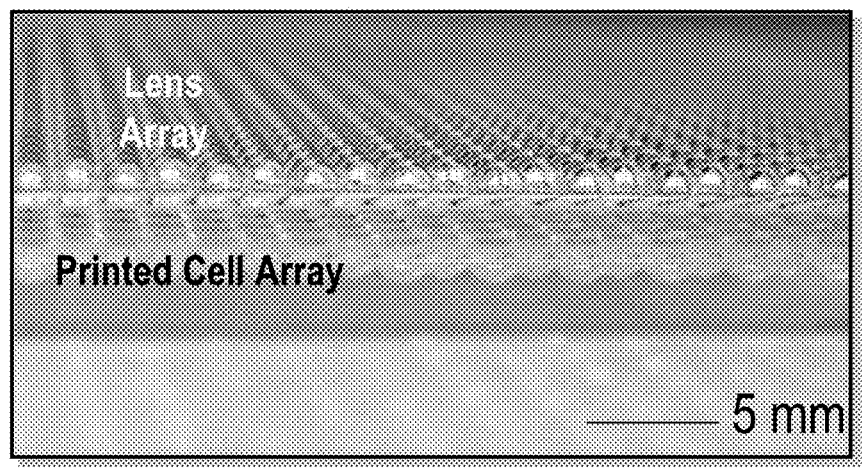
FIG. 8A is a side view photograph and FIG. 8B is a plan view photograph illustrating an array of optical concentrators and solar cells according to some embodiments described herein, while FIG. 8C further illustrates the array of optical concentrators and cells of FIGS. 8A and 8B.
Figure 8B:
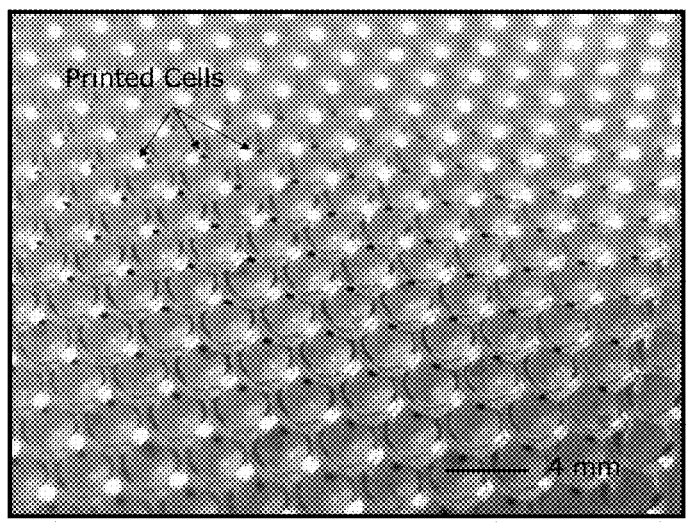

FIG. 8A is a side view photograph and FIG. 8B is a plan view photograph illustrating an array of optical concentrators and solar cells according to some embodiments described herein. In FIG. 8A, the optical concentrators are plano-convex lenses and the solar cells are 0.3 mm gallium arsenide-based cells assembled by a transfer printing process. The optical concentrators are formed in molded glass to define the micro-lens array, and the backplane is a glass substrate that is separated from the array of concentrators by approximately one millimeter. The electrical interconnects on the backplane are not shown in these examples.

Figure 8C:
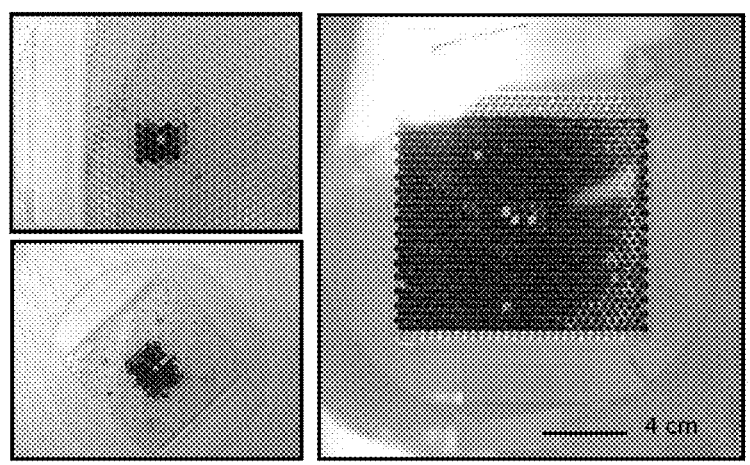
FIG. 8D is a photograph illustrating the array of optical concentrators and CPV cells at an off-axis angle.
FIG. 8E is a photograph illustrating the array of optical concentrators and CPV cells at an on-axis angle, and FIG. 8F schematically illustrates the module as viewed from different locations.

FIG. 8C further illustrates the array of optical concentrators and cells of FIGS. 8A and 8B. In particular, FIG. 8C illustrates the molded glass lens array placed over the array of 0.3 mm solar cells assembled on the glass backplane or substrate, when viewed from various vantage points at differing distances and at normal incidence (i.e., on-axis) to the CPV module. In FIGS. 8A-8C, the substrate is separated from the array of concentrators by spacer structures that provide a spacing of approximately one millimeter therebetween. These images show views of the module from close-up (FIGS. 8A and 8B) and further away (FIG. 8C) at normal incidence to the module.

Figure 8D:
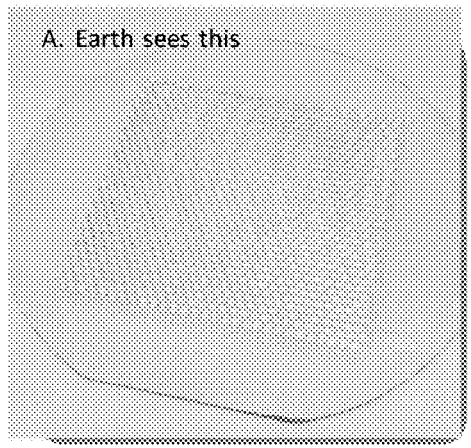
Figure 8E:
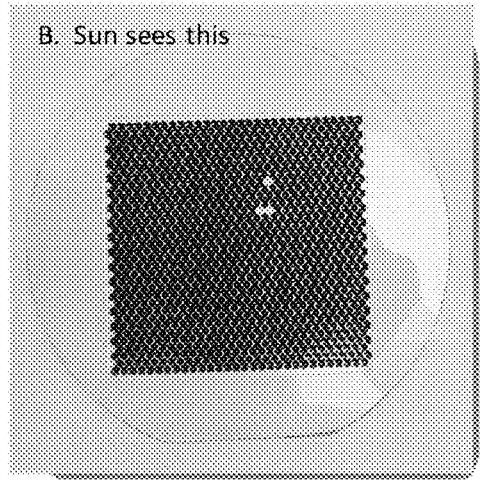
Figure 8F:
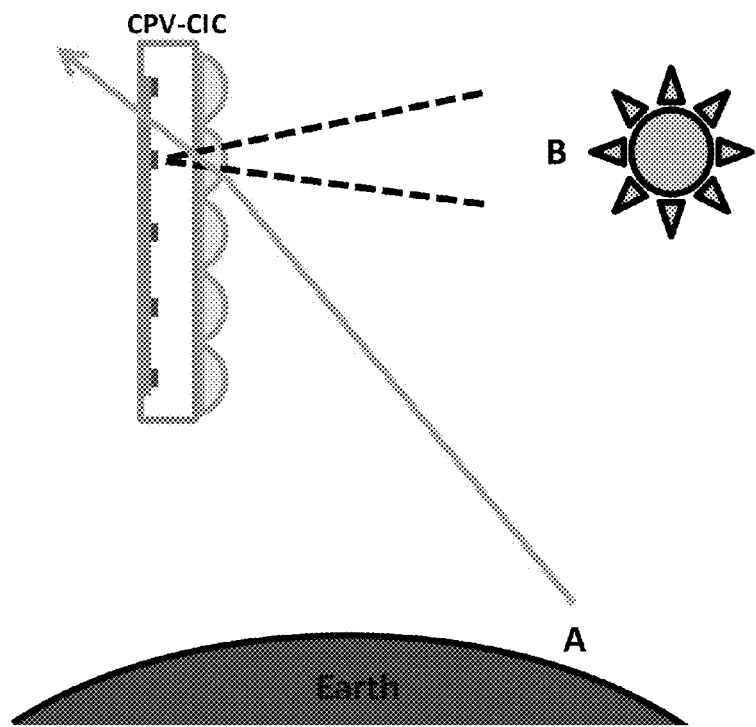

FIG. 8E similarly illustrates the array of optical concentrators and CPV cells at an on-axis angle. In contrast, FIG. 8D illustrates the array of optical concentrators and CPV cells at an off-axis angle, while FIG. 8F schematically illustrates the module as viewed from different locations. Because the concentrating optical elements described herein can limit the angle of acceptance, the CPV cells are not visible (as shown in FIG. 8D) to an observer at an off-axis angle with respect to the optical axes of the elements of the lens array (e.g., from location "A" on Earth, shown in FIG. 8F), while an the CPV cells appear to be magnified (as shown in FIG. 8E) to an observer at an on-axis angle with respect to the optical axes of the elements of the lens array (e.g. from the sun, at location "B" shown in FIG. 8F). As such, CPV modules described herein can be designed to be transparent, or even reflective, to terrestrial-based sources. In addition, because the CPV optics can limit the angle of acceptance as shown in FIGS. 8D-8F, terrestrial directed energy threats may be unable to strike the plane of some CPV modules described herein at an angle that permits the directed energy threat to intersect the electrically active CPV cells on the substrate.

Figure 9A:
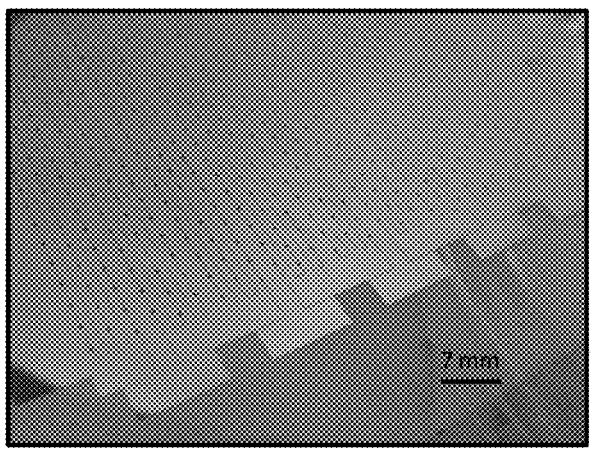
FIGS. 9A-9C are photographs illustrating an array of solar cells assembled on a backplane surface and electrically connected by interconnection features of the backplane surface according to some embodiments described herein
Figure 9B:
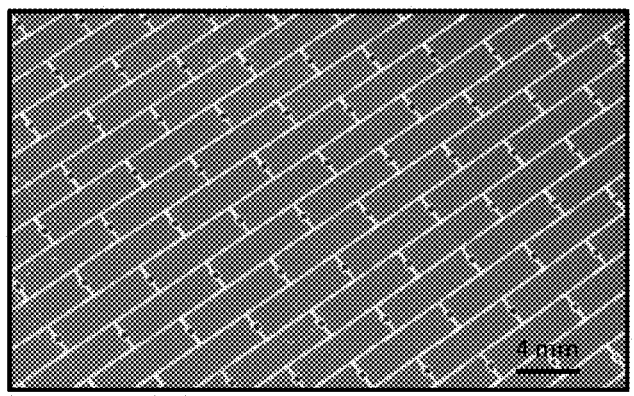
Figure 9C:
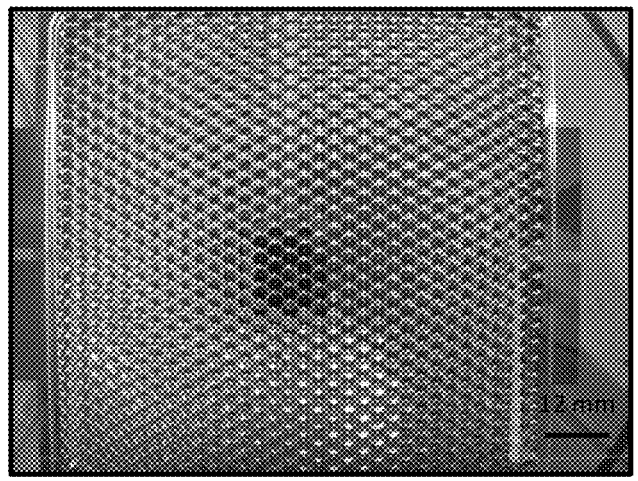

FIGS. 9A-9C are photographs illustrating an array of solar cells assembled on a backplane surface and electrically connected by interconnection features of the backplane surface according to some embodiments described herein. In particular, FIGS. 9A-9C illustrate a glass backplane with thin film copper interconnection features and an array of cells described herein. FIG. 9A, the solar cells are electrically connected in series (a series of parallel-connected blocks of solar cells), while in FIG. 9B, the solar cells are electrically connected in parallel (a parallel set of series connected strings of solar cells). However, it will be understood that the solar cells may be electrically connected in any series and/or parallel combination in accordance with embodiments described herein. The solar cell configurations of FIGS. 9A and/or 9B can be then placed underneath an array of concentrator optics, which are illustrated in FIG. 9C. In particular, FIG. 9C illustrates an array of molded glass optical concentrators, where the backplane is separated from the array of concentrator optics by one millimeter by one or more optically transparent spacer structures.

Figure 10A:
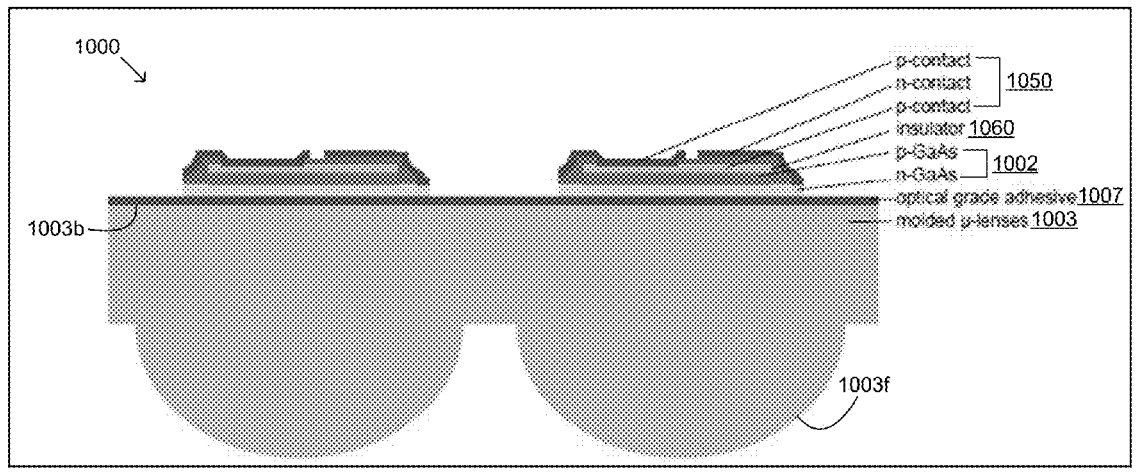
FIGS. 10A and 10B illustrate a CPV module that is free of air or vacuum interfaces between the concentrating optical elements and the solar cells, according to some embodiments described herein.
Figure 10B:
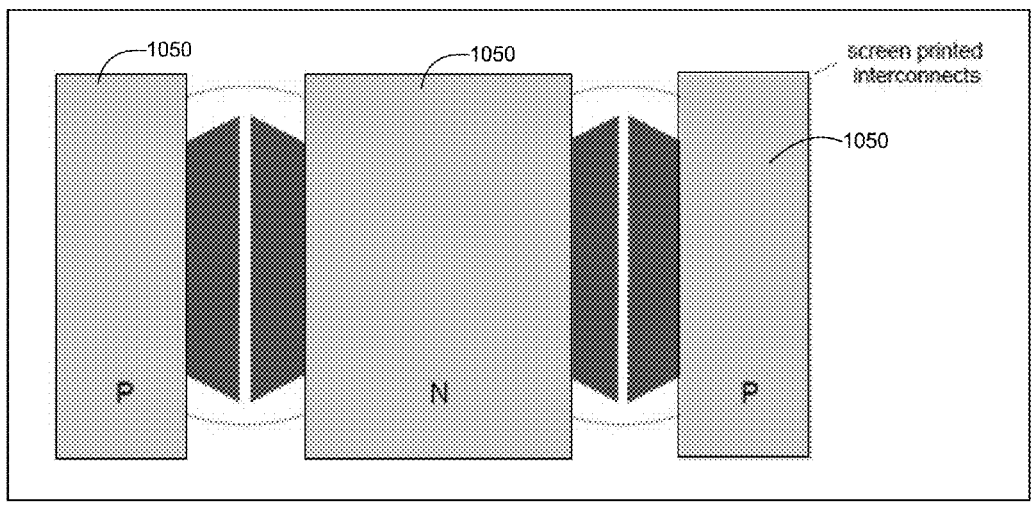

In some embodiments described herein as shown by way of example in FIG. 2, the solar cells may be provided on the back/second surface of the concentrating optical element(s) such that the CPV module is free of (e.g., does not include) an air or vacuum interface between the concentrating optical elements and the solar cells, as shown in FIGS. 10A and 10B in greater detail. In FIGS. 10A and 10B, the back/second surface 1003$b$ of the array of concentrator optics 1003 functions as a backplane surface with the CPV cells 1002 mounted attached thereto by an optical-grade adhesive layer 1007, and insulating layers 1060 and electrical interconnections 1050 providing n- and p-contacts are formed on the backplane surface 1003$b$, for example, by a screen printing process.

In particular, as shown in FIG. 10A, a CPV module 1000 according to some embodiments described herein includes concentrating optical elements in the form of a lens array 1003 having a front/first surface 1003$f$ that is configured to receive incident light, and a back/second surface 1003$b$ on which an array of CPV cells 1002 are assembled. CPV cells 1002 may be printed or otherwise assembled such that their respective light receiving surfaces are mounted on or otherwise facing the back surface 1003$b$ of the lens array 1003. The conductive terminals of the CPV cells 1002 may be provided on the back surfaces of the CPV cells 1002 (which are opposite the light receiving surfaces), and the conductive traces or other electrical interconnections 1050 may be formed by screen printing to contact the conductive terminals on the back surfaces of the CPV cells 1002.

Figure 11A:
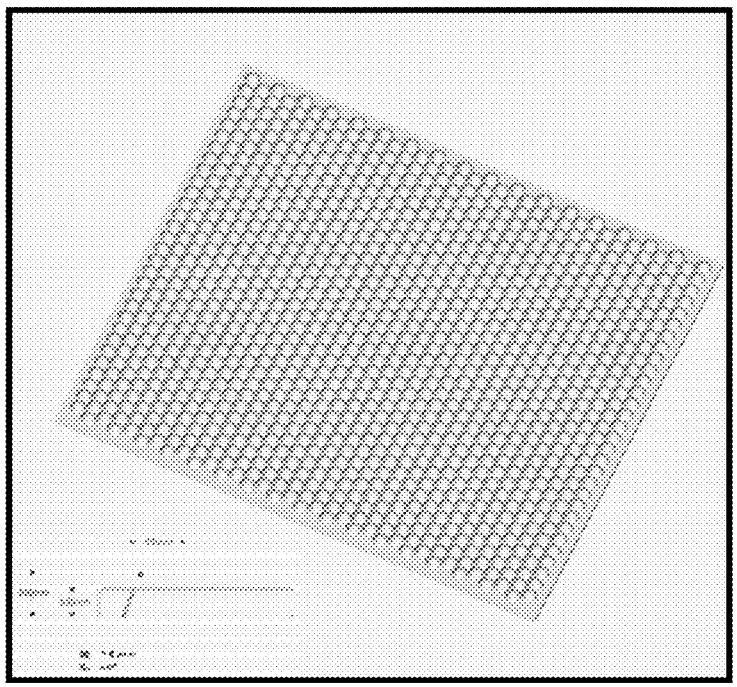
FIGS. 11A-11C are photographs illustrating various views of an array of optical concentrators according to some embodiments described herein.
Figure 11B:
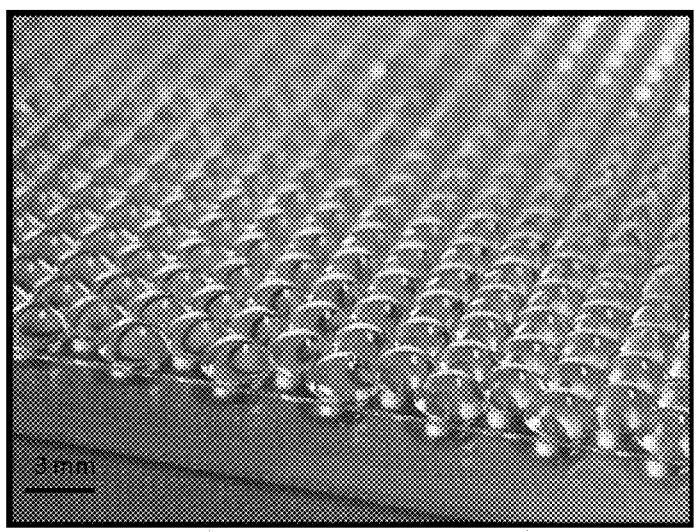
Figure 11C:
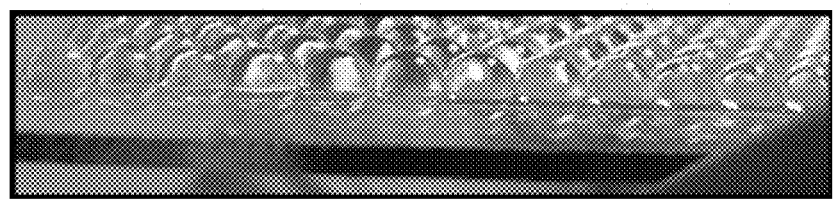

FIGS. 11A-11C are photographs illustrating various views of an array of optical concentrators according to some embodiments described herein. The concentrating optics are illustrated as silicone lenses that are molded on a flat glass plate, also referred to as silicone-on-glass. In FIGS. 11A-11C, the optical concentrators are plano-convex lenses, and the array includes 900 individual optical concentrators, also referred to as lenslets. The spacing between individual concentrators in these embodiments are 3 mm.

In some embodiments described herein, individual CPV cells or groups of CPV cells of CPV modules can be optically or electrically tested on the wafer or other substrate, and defective cells or groups of cells can be repaired by physically disconnecting unwanted electrical connections (i.e. shunted or shorted cells) and forming electrical connections across defective electrical node separations (i.e. breaks in the backplane circuit caused by defective cells or contacts). For example, defective cell(s) can be repaired by physically disconnecting the unwanted electrical connections using laser ablation. In addition, defective cell(s) can be repaired by forming electrical connections across the defective electrical node separations by laser induced chemical vapor deposition of metals or by ink jet printing of colloidal metal inks.

Figure 12:
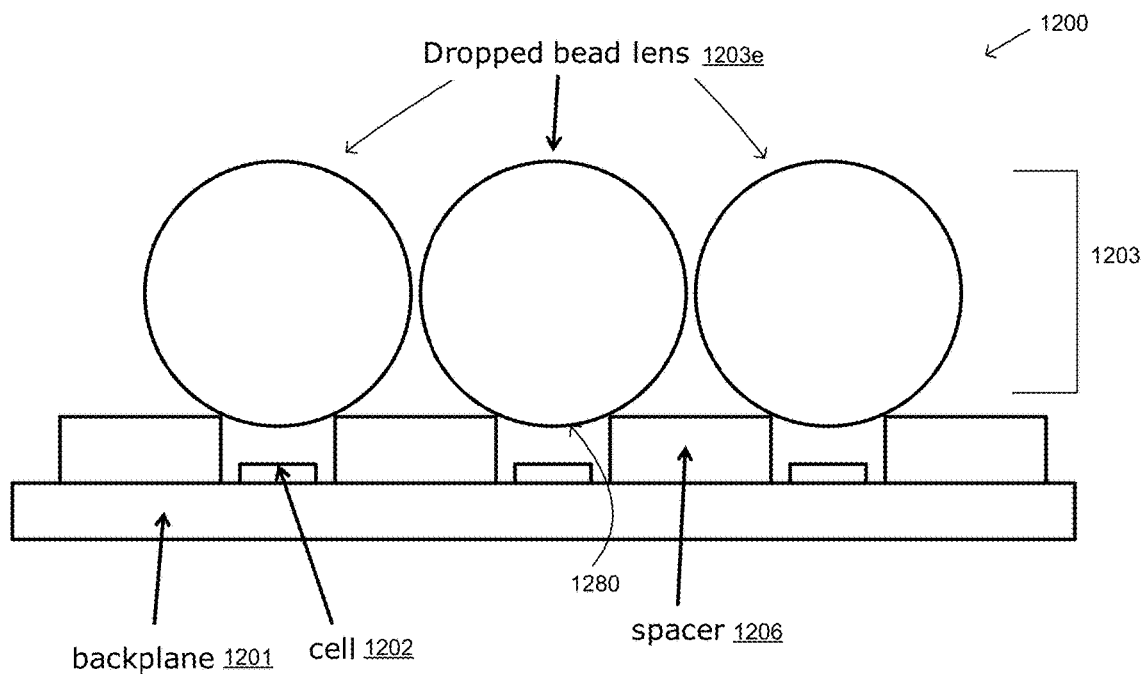
FIGS. 12 and 13 illustrate further implementations of spacer structures according to some embodiments described herein.
Figure 13:
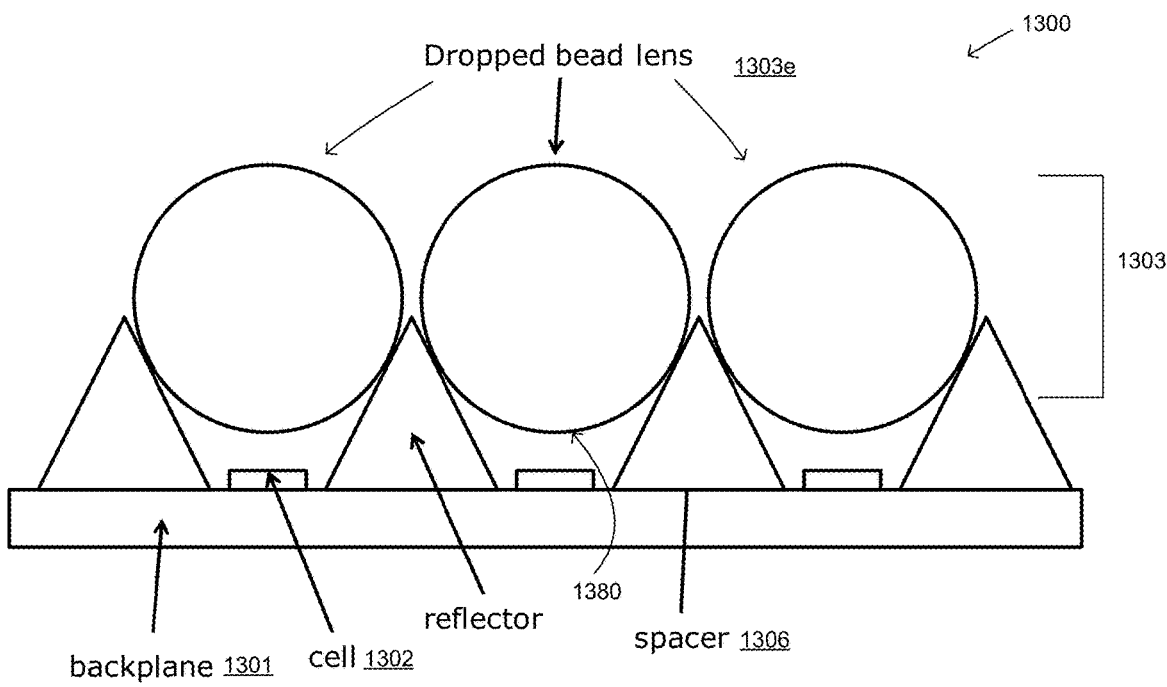
Figure 15A:
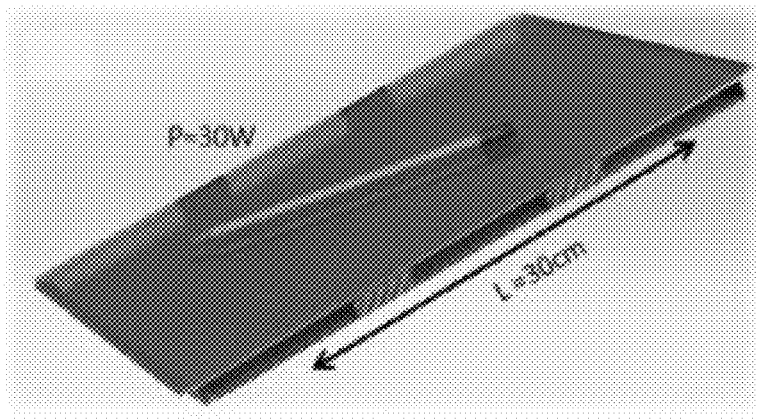
FIGS. 15A-15E illustrate some conventional concepts for microscale CPV in space applications.
Figure 15C:
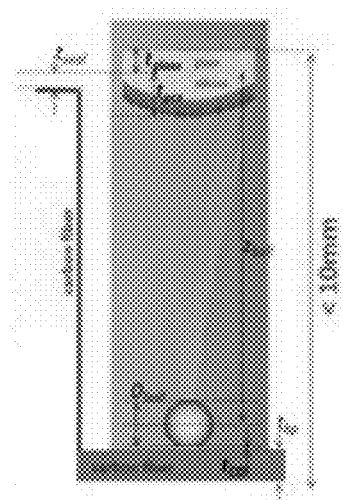
Figure 15B:
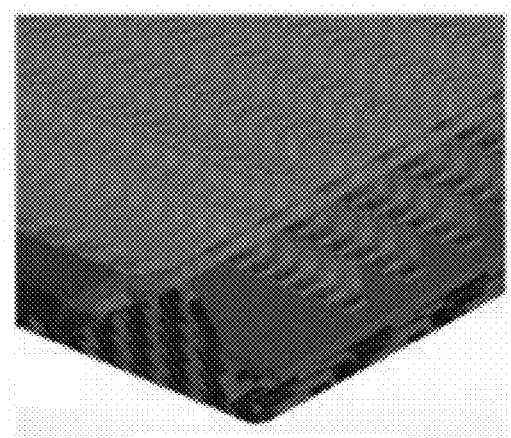
Figure 15D:
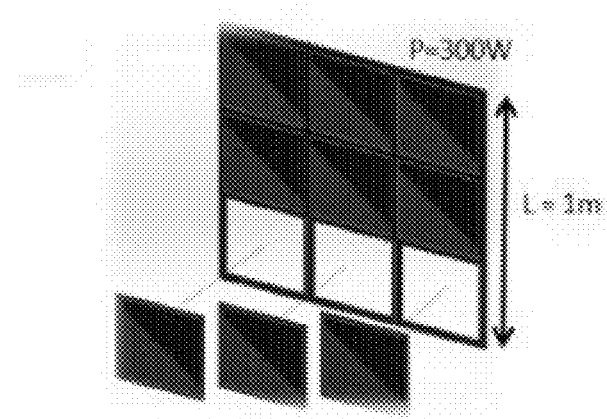
Figure 15E:
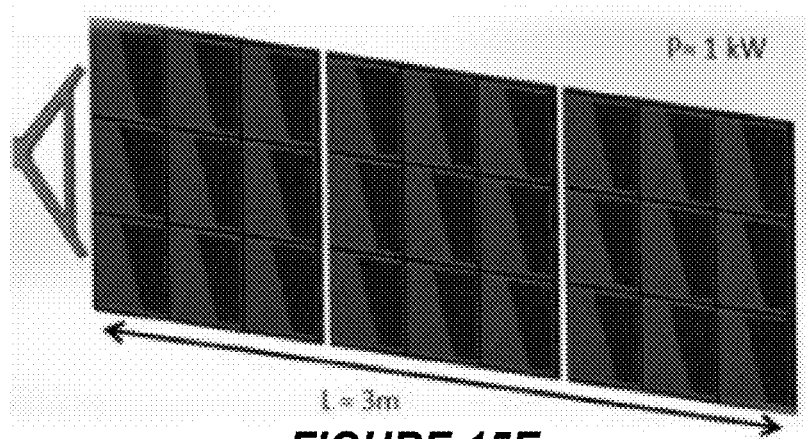

FIGS. 12 and 13 illustrate further implementations of spacer structures described herein. As shown in FIGS. 12 and 13, the spacer structures 1206 and 1306 protrude from backplane surfaces 1201 and 1301 to provide integration, spacing (with respect to respective focal lengths), and self-centering of the lens elements 1203$e$ and 1303$e$ of the lens arrays 1203 and 1303, respectively. In the embodiments of FIGS. 12 and 13, the backplane surfaces 1201, 1301 may include the array of spacer features 1206, 1306 between the CPV cells 1202, 1302. Also, the array of optical concentrators 1203, 1303 may be an array of spherical ball lenses 1203$e$, 1303$e$ and/or other shaped lenses, which can be assembled by self-centering in the arrays of spacer features 1206, 1306 on the backplane surfaces 1201, 1301.

In particular, FIG. 12 illustrates a CPV module 1200 according to some embodiments described herein in which the array of optical concentrators 1203 is implemented as an array of spherical ball lenses 1203$e$. The backplane surface 1201 further includes an array of spacer features 1206, which protrude from the surface 1201 in-between areas including the CPV cells 1202 thereon. The array of glass ball lenses 1203$e$ can be assembled by placing or dropping the glass ball lenses 1203$e$ onto the backplane surface 1201, such that the ball lenses 1203$e$ can be self-centered by the spacer features 1206. The spacer features 1206 of FIG. 12 have a rectangular shape in cross-section, and are spaced and/or otherwise configured such that the ball lenses 1203*e* can be positioned by self-centering in areas between adjacent spacer features 1206. While illustrated with reference to spherical or ball shaped lenses 1203*e*, it will be understood that optical concentrators having other shapes may be used, and the size, shape, and/or spacing of the spacer features 1206 may be selected in accordance with the size and/or shape of the optical concentrators (or vice-versa) to allow self-centering of the concentrators.

In the embodiment of FIG. 13, the spacer features 1306 on the backplane surface 1301 may be reflective and/or otherwise shaped to direct a portion of the incident sunlight onto the CPV cells 1302 of the module 1300. The array of optical concentrators 1303 is implemented as an array of spherical ball lenses 1303*e*. The backplane surface 1301 further includes an array of spacer features 1306, which protrude from the surface 1301 in-between areas including the CPV cells 1302 thereon. In particular, FIG. 13 illustrates an array of glass ball lenses 1303*e* that can be assembled by placing or dropping the glass ball lenses 1303*e* onto the backplane surface 1301, such that the ball lenses 1303*e* can be self-centered by the spacer features 1306. The spacer features 1306 of FIG. 13 have a triangular shape in cross-section, and are spaced and/or otherwise configured such that the ball lenses 1303*e* can be positioned by self-centering in areas between adjacent spacer features 1306. The spacer features 1306 of FIG. 13 are sized, shaped, positioned, and/or formed of materials so as to reflect at least a portion of incident light onto the CPV cells 1302. Also, while illustrated with reference to spherical or ball shaped lenses, it will be understood that optical concentrators having other shapes may be used, and the size, shape, and/or spacing of the spacer features 1306 may be selected in accordance with the size and/or shape of the optical concentrators (or vice-versa) to allow self-centering of the concentrators.

Also, although illustrated with reference to respective air or vacuum interfaces 1280, 1380 between the optical concentrators and the solar cells in FIGS. 12 and 13, it will be understood that some embodiments described herein may include optical concentrator and/or spacer structure designs that reduce and/or eliminate the air or vacuum interfaces 1280, 1380. For example, the size/shape of the lenses 1203*e*, 1303*e* and the spacing of the spacer features 1206, 1306 may be selected such that the lenses 1203*e*, 1303*e* contact the CPV cells 1202, 1302, without the air or vacuum interface in the light path therebetween, when self-aligned by the spacer features 1206, 1306.

Further embodiments described herein are directed to the use of multi-junction, micro-scale concentrator-type photovoltaic (CPV) cells in space applications. Trends toward lower launch costs into higher radiation orbits may benefit from the use of CPV modules. Some embodiments described herein provide CPV designs for space that are based on microcells with up to 6 junctions. Some microcell CPV designs are described herein along with cell designs which leverage microtransfer printing to enable up to 6 or more junctions.

The use of CPV modules for spacecraft applications may be valuable for its potential for higher specific power, lower cost and potential for significantly increased radiation tolerance. Some conventional designs have ranged from low concentration reflective systems like AstroEdge™ array for the NRO STEX spacecraft, to higher concentration designs such as the SCARLET arrays used on Deep Space 1 spacecraft, to (more recently) by stretched lens arrays (SLA) use a linear Fresnel lens built from silicone.

Some merits of CPV modules in space applications include cost and efficiency. Cost may be a significant benefit that CPV modules can offer in comparison to III-V coverglass-integrated cells (CICs), allowing for a reduction in one of the cost drivers of CICs (the III-V materials) by orders of magnitude. The use of CPVs can also enable higher conversion efficiency than cells operating under air mass zero (AM0) conditions, impacting both specific power (W/kg) and volumetric power density (W/m$^3$). The additional mass associated with the optics and mechanical support structures in CPV modules may be a drawback, but comes with the advantage of improved radiation hardness. The proliferation of solar electric propulsion (SEP) and associated missions in low-earth orbit (LEO) may call for radiation hard solar arrays with extremely high efficiency and lower cost, in which CPV modules can offer clear advantages over some conventional technologies. CPV modules may also provide benefits in low-intensity, low temperature (LILT) environments, where the elevated concentration levels may overcome many of the typical challenges associated with high performance PV conversion in LILT environments.

Embodiments described herein with respect to CPV modules for space applications differ from some conventional efforts, at least in that some embodiments leverage the advantages of microscale photovoltaics, including the use of microtransfer printing (uTP). FIGS. 14A-14D illustrate some elements of microscale CPV for space applications (FIGS. 14A-14C) and the process of micro-transfer printing (FIG. 14D). Using solar cells having surface areas of less than about 4 square millimeters may allow for low profile optical designs without extremely low f/#; improved thermal dissipation; mitigation of effects of CTE mismatch between cell and substrate; and the elimination of electrical gridlines, improving optical efficiency. The elements of the some microscale CPV space modules are shown in FIGS. 14A-14D, including: microlens arrays made of glass and/or silicone (FIG. 14A); low-profile optical design (<5 mm) (FIG. 14B); gridless multijunction cells (<200 μm) (FIG. 14C); and integration by microtransfer printing (FIG. 14D). The use of uTP may introduce numerous design and assembly opportunities. For example, microtransfer printing can allow multiple cells to be mechanically stacked, allowing for improved-efficiency MJ cells to be produced without the need for wafer bonding techniques. In addition, uTP can allow the solar cells to be assembled on non-native substrates. In space applications, this can allow for placement of the solar cells on a lower cost, electrically active substrate (e.g., silicon), which can generate power even if tracking accuracy is lost for the CPV microcells.

Some conventional concepts for microscale CPV in space were focused on the miniaturization of existing terrestrial module designs. FIGS. 15A-15E illustrate some such conventional concepts, using a 10 mm thick module (FIG. 15A) built from 1 or 2 ply carbon fiber attached to a silicone on glass lens array (30 cm×30 cm). The backplane of the modules (FIG. 15B) contains surface-mountable solar cells interconnected by a thin printed circuit board. Material selection for the backplane may require matching the CTE (coefficient of thermal expansion) for the backplane and carbon fiber structure as well as the lens array glass.

Figure 16A:
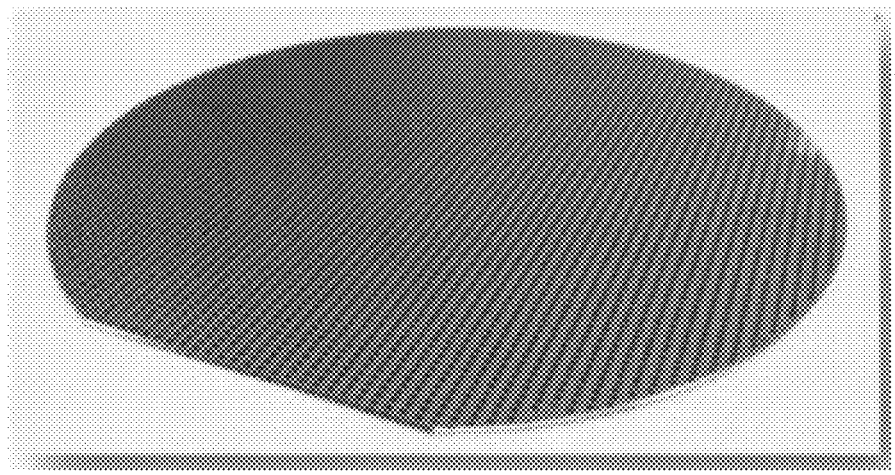
FIGS. 16A-16E illustrate CPV cells integrated into a coverglass-interconnected-cell (CIC) form factor according to some embodiments described herein.
Figure 16B:
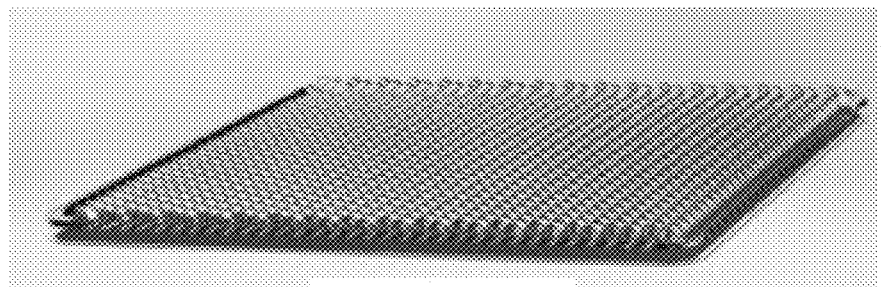
Figure 16E:
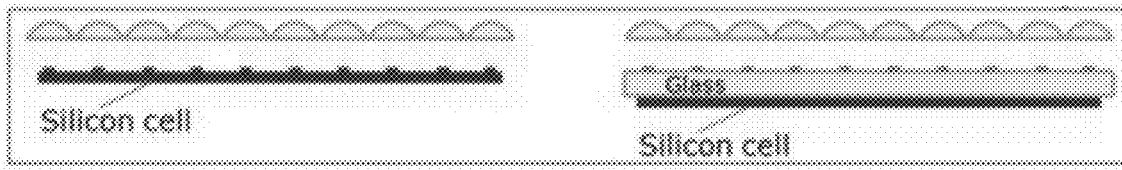
Figures 16C, 16D:
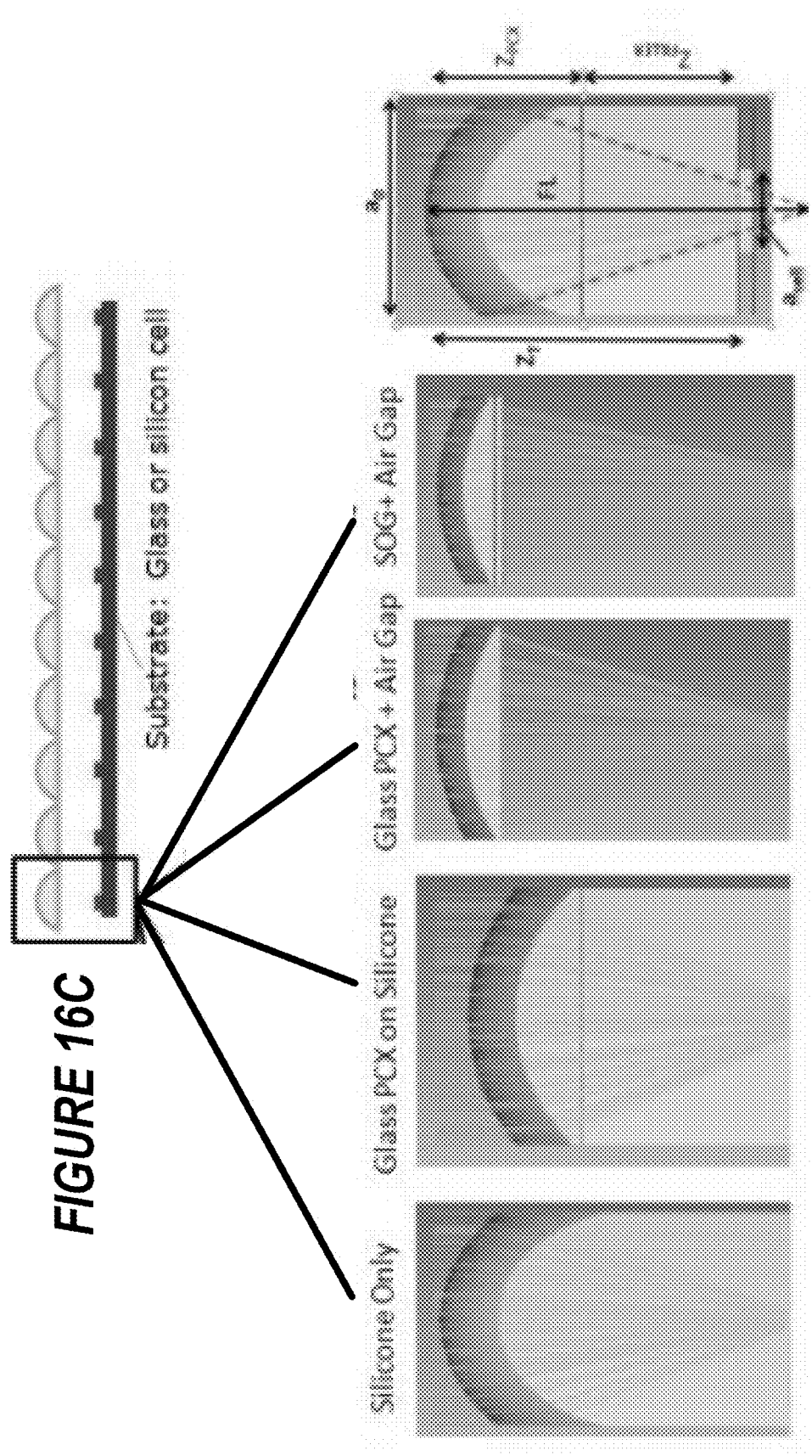

In contrast, some embodiments described herein utilize a different design approach, which integrates CPV cells into a coverglass-interconnected-cell (CIC) form factor. Some features of embodiments described herein are shown in FIG. 16A-16E. In such embodiments, CPV cells are printed directly onto a non-native substrate (FIG. 16A), such as glass or a silicon wafer, using micro-transfer printing techniques. A low profile microlens array is then positioned on top of the substrate wafer (FIGS. 16B and 16C) to form what is referred to herein as a "CPV-CIC" module. Four different implementations of the lens array for CPV-CIC modules described herein are illustrated in FIG. 16D. In FIG. 16E, two different options are shown for the integration of a large area, low cost silicon cell into a CPV-CIC that allows for power generation (albeit at lower efficiency) in case the spacecraft tracking accuracy strays off-axis, that is, beyond the acceptance angle of the CPV optics. Such a backup power capability may be desired in a CPV-CIC; however, while printing CPV cells on top of an active silicon cell may offer an advantage of lower mass, it may introduce challenges for CTE matching. Printing to glass adds the mass of the glass, but offers more design flexibility, as back-up (i.e., non-concentrator-type) silicon cells may or may not be included and more materials with desirable CTE may be available.

As shown in FIG. 16D, some possible CPV-CIC designs may be distinguished by the materials choice for the lens array and the "filler" medium between the lens and cell. The two which use silicone as the filler (silicone-only 1600a and glass on silicon 1600b) may offer advantages of mechanical robustness and the absence of additional mechanical elements to support the lens array above the CPV cells. However, to reduce mass, the overall thickness (ZT) of the silicone-filled designs should be relatively low. This requirement, in turn, may influence the lenslet apertures (i.e. the pitch of the microlens array) to very small scales (e.g. <1 mm) which can pose manufacturing challenges. In contrast, designs which leave an air (or vacuum) gap between the lens array and the cell array (glass-only 1600c and silicone-on-glass 1600d) can be more lightweight, but may require additional structures (such as the spacer structures described herein) to support the lens array. Options for these supports may include springs or shape memory alloys, as shown in FIG. 7G, or even interstitial silicone supports placed at every Nth element of the array, as shown in FIG. 7E.

Two of the designs shown in FIG. 16D are based on optics which expose silicone directly to the space environment (silicone only 1600a and silicone-on-glass 1600d). Without protection, direct exposure to UV radiation and atomic oxygen may rapidly degrade such optics. Embodiments described herein thus include dielectric UV reflective (UVR) coatings deposited directly onto silicone substrates at low temperatures. These coatings are well suited to CPV optics molded from low outgassing, space-qualified (also referred to herein as "space-grade") silicone.

Figure 17A:
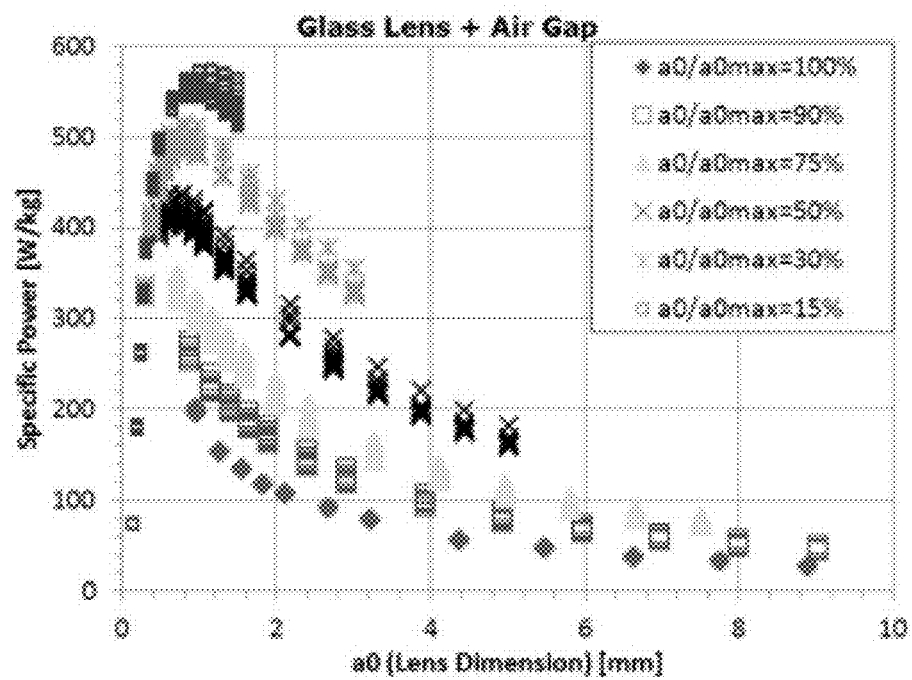
FIGS. 17A and 17B are graphs illustrating efficiency estimates for 4J, 5J and 6J cells, for glass-only and silicone-on-glass designs according to some embodiments described herein, respectively.
Figure 17B:
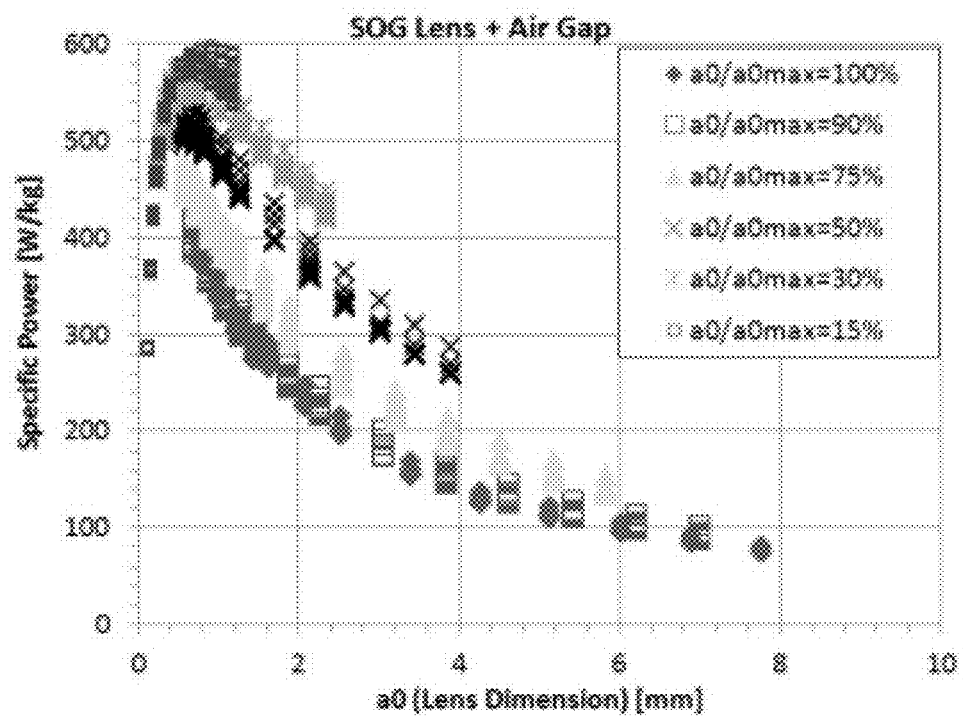

FIG. 16D further illustrates a model 1600m for varying the design parameters for the embodiments 1600a-1600d. Various combinations of focal length (FL), overall length (ZT), lens size (a0,) and relative lens sag (a0/a0_max) are possible in accordance with embodiments described herein, along with estimates of efficiency, optical acceptance angle, mass, specific power computed for each. Some efficiency estimates were computed based on a semi-empirical cell model which provided the voltage benefits of concentration for 4J, 5J and 6J cells, as shown in the graphs of FIGS. 17A and 17B for the glass-only 1600c and silicone-on-glass 1600d designs, respectively. Optical efficiency for each design accounted for losses from reflection as well as the intersection between lenslets, where a 100 micrometer perimeter was used for each glass lenslet and 40 um for silicone molded lenslets. The mass of each design was estimated by computing the volume of the PCX lens plus the filler thickness and assumed a cell-array substrate made of silicon with thickness of 150 micrometers. Cell mass and thin-film metallization interconnects were not included. Specific power was analyzed as a function of various design parameters. As shown in FIGS. 17A and 17B, the dependence on lenslet size (a0, pitch) for glass-only 1600c and silicone-on-glass 1600d may indicate a desired lens pitch of about 1.5 mm for some embodiments, as a balance between reducing mass via a reduction of a0 and overall lens volume, and optical losses incurred as a0 is driven toward zero (i.e. greater lenslet perimeter losses). Furthermore, in the examples of FIGS. 17A and 17B, the highest specific power was observed when the relative lens sag is smallest (a0/a0_max=15%).

Figure 18B:
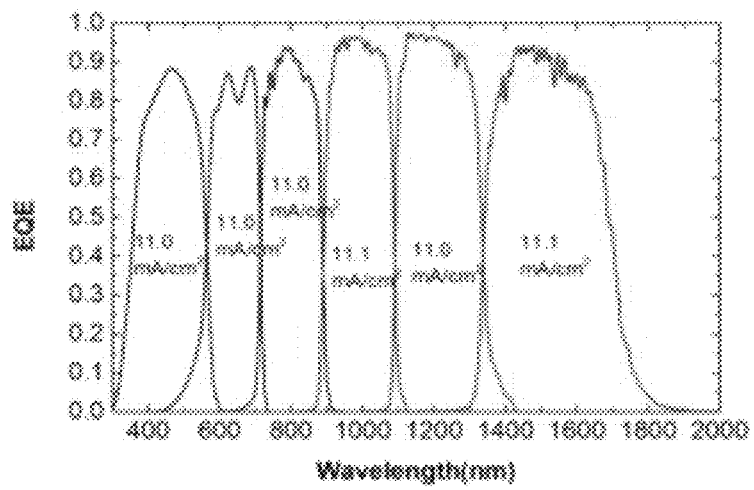
FIGS. 18A-18C illustrate a multijunction (MJ) solar cells formed by mechanically stacking multiple solar cells and related performance according to some embodiments described herein.
Figure 18A:
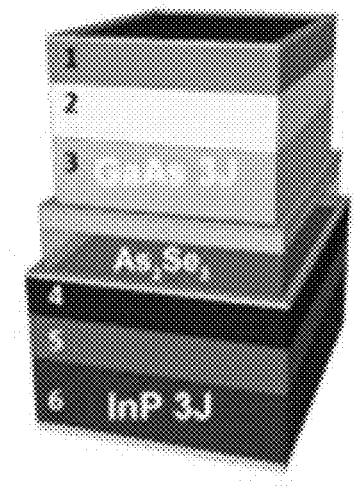
Figure 18C:
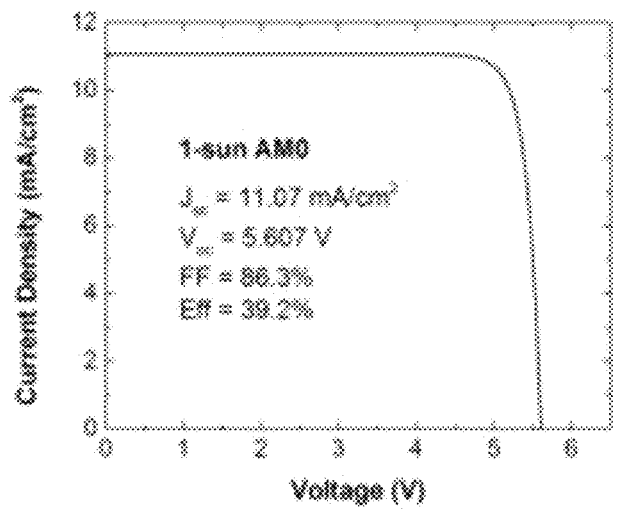

Mechanically stacking multiple solar cells by uTP in a highly parallel assembly method to define a multijunction (MJ) cell 1800 is illustrated in FIGS. 18A-18C. In FIG. 18A, a triple junction cell based on GaAs (AlInGaP/AlGaAs/GaAs) is stacked on top of a triple junction cell based on InP (InGaAsP/InGaAsP/InGaAs), using a chalcogenide glass to form the optical interface. In particular, FIG. 18A illustrates a 6J cell formed by stacking two 3J cells together. A variety of other stacked cell designs with 4 junctions (4J) to 6 junctions (6J), which can offer up to 50% cell efficiency or more under high concentration AM0 illumination for a 6J device, may also be used. The analytical drift-diffusion model uses realistic optical constants and carrier transport properties for III-V materials, leading to accurate device predictions for MJ solar cells. Furthermore, the model is capable of taking into account effects due to multiple reflections between the subcells and the impact of photon recycling. The simulated performance under AM0 at 1 sun concentration for one of these example cell designs is 39%, as shown in FIGS. 18B-18C. The mechanically stacked 6J cell is a lattice matched 3J AlInGaP/AlGaAs/GaAs cell on top of an InGaAsP/InGaAsP/InGaAs cell that is lattice matched to InP.

Figure 19:
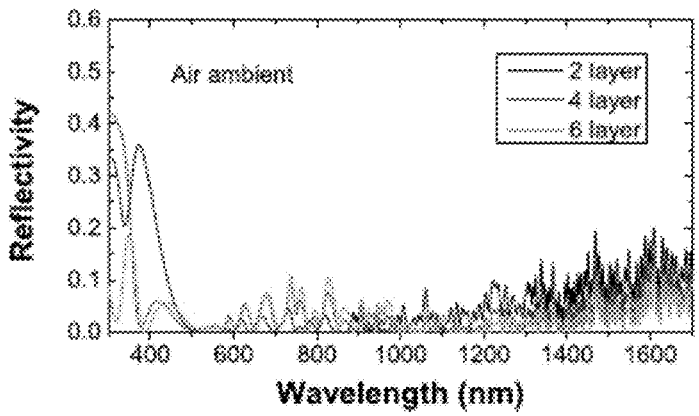
FIG. 19 is a graph illustrating the reflectivity of 2-layer, 4-layer, and 6-layer coatings on a multijunction solar cell according to some embodiments described herein.

Six junction cell designs as described herein may make use of a broad band of the AM0 spectrum (for example, less than about 300 nm to greater than about 1700 nm). The design of broadband Herpin antireflective (AR) coating using 2-6 layers may be used to provide low reflectivity over this range. FIG. 19 is a graph illustrating the reflectivity of 2-layer, 4-layer, and 6-layer $SiO_2/TiO_2$ Herpin-type coatings on a 6J solar cell. The 2, 4, and 6 layer designs may yield lower reflectivity over more than the bandwidth spanning from about 300 nm to about 1700 nm.

Figure 20A:
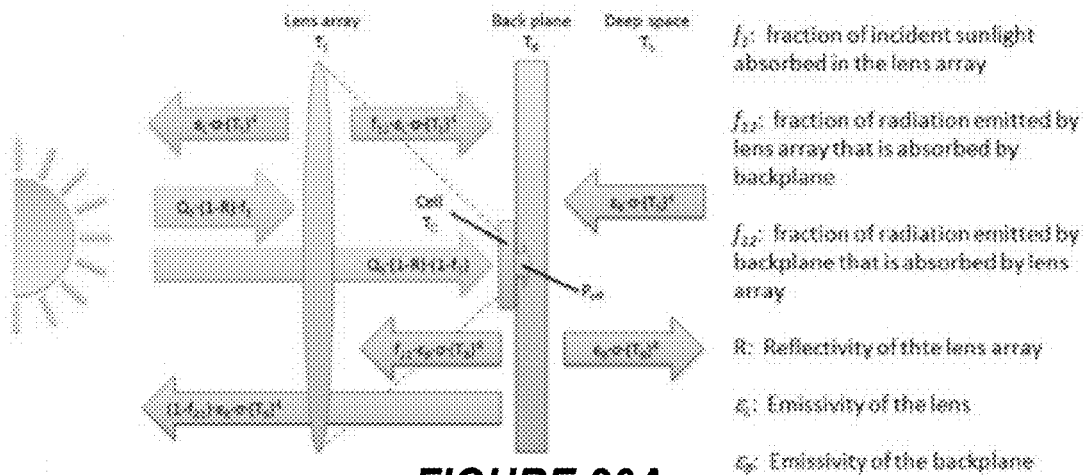
FIG. 20A illustrates an analytical thermal model that decouples the thermal behavior of the backplane from the lens.

Solar cells under concentrated illumination generally operate at higher temperatures than solar cells under no concentration (1 sun). Because heat dissipation in the space environment may be reliant on radiative cooling only, the operating temperatures of microscale cells may be of particular importance in a space CPV design. FIG. 20A illustrates an analytical thermal model that decouples the thermal behavior of the backplane from the lens. In particular, the thermal model of FIG. 20A illustrates temperatures in a space CPV module that has the lens separated from the backplane, such that only radiative coupling transfers heat between the lens and backplane model. Expressing the heat flux relationships for each component in the system as a set of coupled equations, and establishing the extracted power of the cell as a function of temperature using the analytical drift-diffusion model, the solar cell temperature can be determined numerically assuming a particular thermal resistance between the CPV cell and the backplane.

Figure 20B:
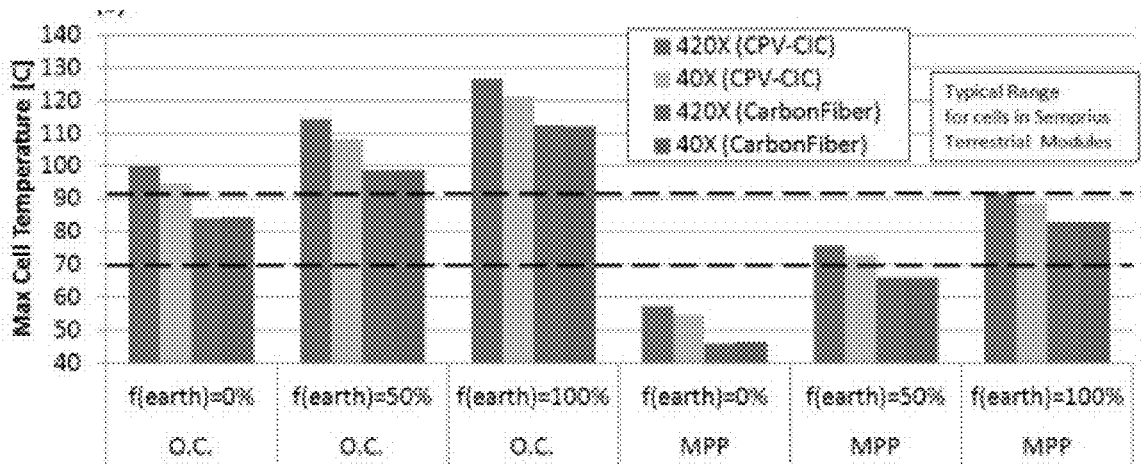
FIG. 20B illustrates results of thermal modeling across a variety of conditions based on the analytical model of FIG. 20A.

FIG. 20B illustrates results of thermal modeling across a variety of conditions (open circuit (O.C.), maximum power point (MPP) various concentrations, etc.) from analysis of the cell and backplane using boundary conditions derived from the analytical model of FIG. 20A. The lens array temperature from the analytical model was used to provide the appropriate boundary conditions for modeling of the cell and backplane. In FIG. 20B, results for two different designs under a number of different cases are shown—(i) a CPV-CIC design in accordance with some embodiments described herein, with lens and cell-array pitch of 3 mm with cells printed to a glass substrate and encapsulated with silicone, and (ii) a carbon-fiber module design with 5 mm array pitch in which the cells are printed to silicon interposers which are surface mounted to a circuit board on the module interior. For both design types, concentration factors of 40× and 420× and varied the boundary conditions were used to correspond to three different conditions of earth view factor, as well as open circuit (no heat removed by PV cells) or operating conditions (maximum power point tracking (MPPT)). FIG. 20B illustrates that, under operating conditions (MPPT), the highest temperatures (100% earth view) are between 80° C. and 90° C. When no power is generated (e.g. at open circuit), however, the cell temperature can exceed 110° C. For comparison, data corresponding to the temperature range over which microtransfer printed cells have been previously tested is indicated by the dashed lines.

FIG. 20B further illustrates that there may be a relatively weak dependence of solar cell temperature on concentration, which may be a result of the small cell dimensions. In FIG. 20B, the variation of concentration was accomplished by changing the solar cell size while holding the lens size constant; the total power incident on the solar cell was the same for either concentration. A result from thermal modeling of a 1-dimensional radial system (e.g. a disk or an infinite rod) indicates that peak temperature scales with the square of the total radial dimension of the disk or rod, R0:

$$T(r)=q/(4k)*(R0^2-r^2)$$

where q is the heat load, and k is thermal conductivity. It follows that although the intensity of the illumination on the cells increased with the square of the dimension reduction, the relative peak temperature at the center of the smaller dimension spot decreased by the square of this dimension, which quantifies some benefits of using microscale cells for CPV in a space application. If the solar cells were larger, the temperature increase associated with concentration factors over 40× to 100× would be larger as well.

Elevated solar cell temperatures are typically to be avoided, but under Low Intensity, Low Temperature (LILT) conditions of deep space, the elevated temperatures and current density produced by optical concentration can be a benefit. Extremely low temperatures can increase the likelihood that thermionic barriers in the solar cells may impede current flow. Tunnel junction operation can also be adversely affected. Low intensity illumination conditions may also be problematic because they may increase the relative effect of leakage paths, which can dominate device performance. Regardless of the cause—shunt paths through defects, metal-semiconductor-like shunts, mesa sidewall leakage, or trap-assisted tunneling—the impact of leakage effects may be worse when the photocurrent density is low. Optical concentration can counteract this problem, as illustrated in FIGS. 21A-21B. In particular, FIGS. 21A-21B illustrate modeled performance of a 6-junction solar cell under LILT Conditions, with leakage current determined by $10^5$ $\Omega \cdot cm^2$ shunt resistance. The effect of shunt resistance on solar cell performance was modeled for a 6J solar cell at a distance of 5 AU from the sun, corresponding to approximately 55 W/m2. A cell with shunt resistance of $10^5$ $\Omega \cdot cm^2$ may have little impact at 1 sun intensity, but at 5 AU the leakage current associated with this shunt resistance may strongly limit the efficiency. FIGS. 21A-21B show, however, that even a modest concentration of 10 suns can significantly reduce the impact of the shunt current, which can thus eliminate one of the problems associated with solar cell performance in the LILT environment.

As described herein, employing concentration in the design of space solar power generation can enables a higher efficiency panel for reasons including higher voltage associated with concentration, better performance under LILT environments, etc. Such higher efficiency means that a module with greater mass can be accommodated for the same specific power (W/kg); thus, more radiation shielding may be used in concentrating designs because their higher efficiency permits more mass surrounding the cells.

Benefits of increased radiation shielding for lightweight microscale CPV designs can substantial. FIGS. 22A-22B illustrate simulation results for electron and proton spectra in two canonical orbits (LEO, MEO) after passing through radiation shielding provided by a CPV-CIC in accordance with some embodiments described herein. As shown by the orbits in the graphs of FIG. 22A (for LEO: 10y, 1000 km circular, 98° inclination) and FIG. 22B (for MEO: 1y, 20400 km circular, 55° inclination), the radiation spectrum of trapped electrons, trapped protons and solar, event protons which are incident on solar cells of CPV-CIC designs in accordance with some embodiments described herein may be slowed. An impact of these slowed radiation spectra on III-V GaAs based solar cells was further modeled using a displacement damage dose model. Some results, shown in FIGS. 23A-23D, indicate that increased thickness of the lens material can confer a higher degree of radiation shielding. In particular, FIGS. 23A-23D illustrate modeled EOL residual power output of space CPV cell designs using silicone optics for two different canonical orbits (LEO, MEO) in accordance with some embodiments described herein. FIGS. 23A and 23B illustrate the dependence of end of life (EOL) remaining power on the thickness of the radiation shielding for LEO and MEO orbits, respectively, while the EOL solar cell performance for a design shown in FIG. 23C with a relatively small amount of shielding is shown in FIG. 23D. CPV-CIC designs as described herein provide at least as much or more shielding than shown in FIGS. 23A-23D, and thus should result in cell performance loss of less than a few percent, which suggests that overall degradation of the CPV-CIC may be more likely driven by degraded optical transmission of the CPV-CIC, rather than by cell degradation.

Figure 24A:
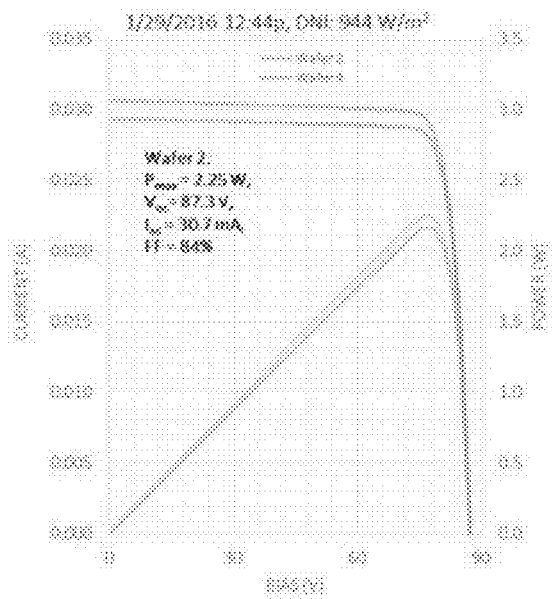
FIGS. 24A-24B illustrate on-sun performance of a prototype CPV-CIC from the "glass+air-gap" design family of FIG. 7C according to some embodiments described herein.
Figure 24B:
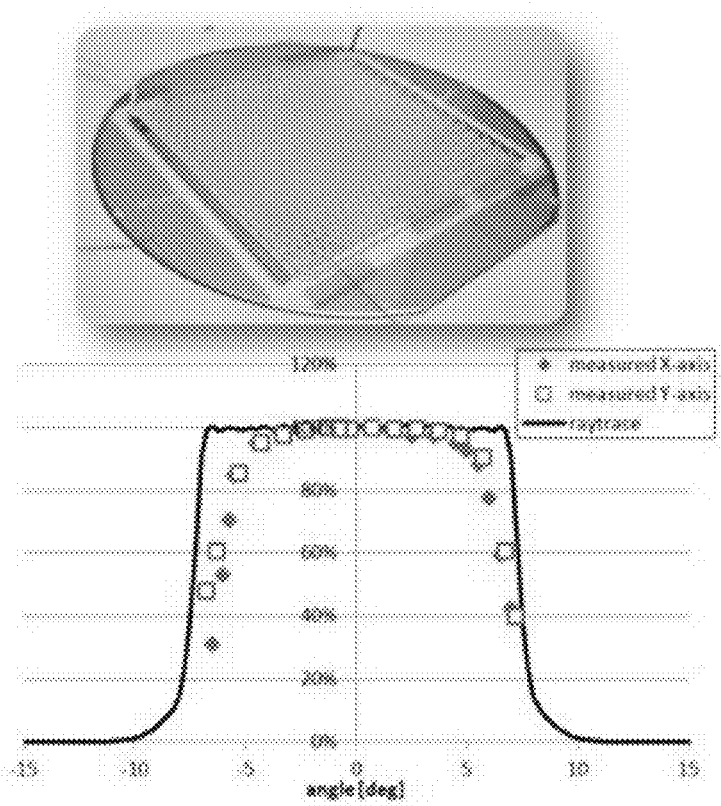

Some prototype CPV-CICs in accordance with embodiments described herein may include 1020 3J solar cells (InGaP/GaAs/InGaAsN) that were micro-transfer printed onto 500 micrometer glass substrates in a hexagonal array. The cells were interconnected by thin film metallization in 34 strings of 30 cells per string. A hexagonal microlens array made of borosilicate was positioned above the cell array focusing incoming light approximately 20×. Six separate prototypes were produced and dark IV testing of the complete array as well as each individual cell showed that all 6 prototypes were electrically functional. Only 3 print failures occurred out of 6×1020=7140 cells (yield=99.96%), which may important because it demonstrates that arrays of many cells can be printed directly to the final substrate without failed cells completely undermining the performance of the finished array. Although these prototypes did not contain lens array AR coatings and the cells were not fully encapsulated, overall performance was relatively high. The 90% acceptance half-angle is modeled to be 7° and measured at >5°. Dark IV and on-sun performance for outdoor, terrestrial illumination are shown for a few prototypes in the graphs of FIGS. 24A-24B. In particular, FIGS. 24A-24B illustrate on-sun performance of a prototype CPV-CIC from the "glass+air-gap" design family of FIG. 7C, with an efficiency of about 30%, as measured outdoors in January. The addition of antireflective coatings, higher concentration, and the use of stacked cells (up to 6 junctions) may allow for overall performance up to about 40% or more (at high concentration and Tcell=25 C).

The present invention has been described above with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. In no event, however, should "on" or "directly on" be construed as requiring a layer to cover an underlying layer.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. [000140] The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

Aspects of the present disclosure are described herein with reference to flowchart illustrations and/or block diagrams of methods and systems according to embodiments. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments of the present invention described herein, and of the manner and process of making and using them, and shall support claims to any such combination or subcombination.

Although the invention has been described herein with reference to various embodiments, it will be appreciated that further variations and modifications may be made within the scope and spirit of the principles of the invention. Although specific terms are employed, they are used in a generic and descriptive sense only and not for purposes of limitation, the scope of the invention being set forth in the following claims.

That which is claimed:

1. A concentrator-type photovoltaic module, comprising:
a plurality of photovoltaic cells having respective surface areas of less than about 4 square millimeters (mm) electrically interconnected on a backplane surface; and
an array of concentrating optical elements having respective aperture dimensions of less than about 30 mm and respective focal lengths of less than about 50 mm, wherein the array of concentrating optical elements is positioned over the photovoltaic cells thereon based on the respective focal lengths to concentrate incident light on the photovoltaic cells, and is integrated on the backplane surface by a plurality of transparent spacer structures adhered to the backplane surface and protruding therefrom between ones of the photovoltaic cells.

2. The module of claim 1, wherein the plurality of transparent spacer structures comprises an optically transparent material and is arranged on the backplane surface such that there is an absence of air in at least one optical path between at least one of the concentrating optical elements and at least one of the photovoltaic cells.

3. The module of claim 2, wherein the array of concentrating optical elements is adhered to the photovoltaic cells with the plurality of transparent spacer structures therebetween such that respective optical paths between the concentrating optical elements and the photovoltaic cells, including the at least one optical path, are free of respective air or vacuum interfaces.

4. The module of claim 3, wherein the plurality of transparent spacer structures comprises a silicone layer having a thickness configured to separate the concentrating optical elements from the photovoltaic cells on the backplane surface by a distance corresponding to the respective focal lengths of the concentrating optical elements.

5. The module of claim 4, wherein the array of concentrating optical elements comprises:
glass optical elements on the silicone layer opposite the photovoltaic cells; or
silicone optical elements in or on the silicone layer opposite the photovoltaic cells, wherein the silicone optical elements include an optical coating thereon comprising a thin film dielectric layer that is configured to reflect portions of the incident light in an ultraviolet wavelength range away from the silicone optical elements.

6. The module of claim 5, wherein the optical coating further comprises a transparent conductive oxide layer.

7. The module of claim 3, wherein the backplane surface comprises a surface of the array of concentrating optical elements.

8. The module of claim 1, wherein the plurality of transparent spacer structures suspend the array of concentrating optical elements over and spaced apart from the backplane surface at a distance corresponding to the respective focal lengths such that respective optical paths between ones of the concentrating optical elements and the ones of the photovoltaic cells comprise respective air or vacuum interfaces.

9. The module of claim 8, wherein the array of concentrating optical elements comprises:
glass optical elements spaced apart from the photovoltaic cells by the respective air or vacuum interfaces; or
silicone-on-glass optical elements spaced apart from the photovoltaic cells by the respective air or vacuum interfaces, the silicone-on-glass optical elements including a thin film dielectric layer thereon that is configured to reflect portions of the incident light in an ultraviolet wavelength range away from the silicone-on-glass optical elements.

10. The module of claim 8, wherein the plurality of transparent spacer structures are respectively configured to transition between a collapsed state and an expanded state, wherein the plurality of transparent spacer structures position the array of concentrating optical elements over and spaced apart from the backplane surface at a distance corresponding to the respective focal lengths in the expanded state, and wherein the plurality of transparent spacer structures position the array of concentrating optical elements closer to the backplane surface in the collapsed state than in the expanded state.

11. The module of claim 8, wherein the plurality of transparent spacer structures are shaped to direct a portion of the incident light onto the photovoltaic cells and/or are shaped to self-center the concentrating optical elements over respective ones of the photovoltaic cells on the backplane surface.

12. The module of claim 1, wherein the backplane surface comprises a silicon or glass layer including one or more elements thereon that are configured to absorb portions of the incident light that are not concentrated on the photovoltaic cells by the concentrating optical elements, wherein the one or more elements comprise a layer of photovoltaically active material and/or a plurality of non-concentrator photovoltaic elements arranged between respective photovoltaic cells on the backplane surface.

13. The module of claim 1, wherein the array of concentrating optical elements comprise space grade silicone and polyhedral oligomeric silsesquioxane (POSS), comprise a gradient index material such that opposing surfaces of the array are substantially planar, and/or comprise a thickness that is sufficient to provide radiation shielding of the photovoltaic cells with respect to the incident light.

14. The module of claim 1, wherein one or more of the photovoltaic cells comprises a multi junction solar cell including a plurality of photovoltaic cell layers that are mechanically stacked to collectively provide a voltage that is greater than a photon energy of light that is incident on one of the photovoltaic cell layers.

15. The module of claim 1, wherein the array of concentrating optical elements is flexible to bending in at least one dimension, and wherein the backplane surface comprises a flexible substrate including the photovoltaic cells thereon that is flexible to bending in the at least one dimension, such that the module is configured to be stowed in a rolled-up or folded fashion.

16. A concentrator-type photovoltaic module, comprising:
a plurality of photovoltaic cells on a flexible backplane surface and electrically interconnected in series and/or parallel thereon;
a concentrating optical element that defines a flexible lens array integrated on the flexible backplane surface over the photovoltaic cells, wherein the flexible lens array is configured to concentrate incident sunlight on the photovoltaic cells with an absence of air therebetween; and
a plurality of transparent spacer structures adhered to and protruding from the backplane surface between ones of the photovoltaic cells and supporting the flexible lens array.

17. The module of claim 16, further comprising an air or vacuum interface in an optical path between the flexible lens array and the photovoltaic cells, wherein the air or vacuum interface is configured to cause refraction of the incident sunlight that is output from a back surface of the flexible lens array and is directed toward the photovoltaic cells.

18. The module of claim 16, wherein the photovoltaic cells are directly on a surface of the flexible lens array such that an optical path between the flexible lens array and the photovoltaic cells is free of an air or vacuum interface.

19. The module of claim 18, wherein the surface of the flexible lens array including the photovoltaic cells thereon defines the flexible backplane surface, and wherein conductive terminals of the photovoltaic cells are contacted opposite the surface of the flexible lens array.

20. The module of claim 16, wherein the plurality of transparent spacer structures comprise a material that is configured to be compressed when the module is stowed in a rolled-up or folded fashion.

* * * * *